(12) United States Patent
Poornachandran et al.

(10) Patent No.: US 10,031,993 B1
(45) Date of Patent: Jul. 24, 2018

(54) APPLICATION STORE MODEL FOR DYNAMIC RECONFIGURATION OF A FIELD-PROGRAMMABLE GATE ARRAY (FPGA)

(71) Applicant: Intel Corporation, Santa Clara, CA (US)

(72) Inventors: Rajesh Poornachandran, Portland, OR (US); Ned M. Smith, Beaverton, OR (US); Vincent J. Zimmer, Federal Way, WA (US); Niveditha Sundaram, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/619,844

(22) Filed: Jun. 12, 2017

(51) Int. Cl.
*G06F 8/65* (2018.01)
*G06F 9/44* (2018.01)
(Continued)

(52) U.S. Cl.
CPC ............ *G06F 17/5054* (2013.01); *G06F 8/65* (2013.01); *G06F 9/4401* (2013.01);
(Continued)

(58) Field of Classification Search
CPC .. G06F 21/10; G06F 17/5054; G06F 11/0706; G06F 11/0793; G06F 15/7871; G06F 21/76; G06F 8/65; G06F 9/44521; G06F 8/60; G06F 12/0246; G06F 9/4401; G06F 17/10; H01L 25/0657; H01L 25/16; H05K 1/144; H05K 1/181; H05K 3/222; H05K 2201/10515; H05K 2201/10689; G06Q 50/184
See application file for complete search history.

(56) References Cited

U.S. PATENT DOCUMENTS 8,230,515 B1 * 7/2012 Brewton ................. G06F 21/10
709/203
8,719,949 B1 * 5/2014 Brewton ................. G06F 21/10
709/203
(Continued)

OTHER PUBLICATIONS

U.S. Appl. No. 15/267,322, filed Sep. 16, 2016, entitled, "Technologies for Secure Boot Provisioning and Management of Field-Programmable Gate Array Images," by Ned M. Smith.

*Primary Examiner* — Vibol Tan
(74) *Attorney, Agent, or Firm* — Trop, Pruner & Hu, P.C.

(57) ABSTRACT

A computing device, computer-readable medium, and method are provided to dynamically configure an FPGA of a computing device at runtime without rebooting the computing device. At least one upgradable capability of the FPGA is displayed to a user. The user selects an upgradable capability of the FPGA and accepts a license to enable the selected upgradable capability. An update to a reconfigurable FPGA image associated with the FPGA is obtained in response to issuance of the license. The update to the reconfigurable FPGA image is installed on the FPGA to enable the selected upgradable capability of the FPGA. An operating system of the computing device is notified of the update to the reconfigurable FPGA image at runtime, and the operating system exposes the selected upgradable capability of the FPGA to at least one component of a software stack managed by the operating system.

35 Claims, 8 Drawing Sheets

(51) Int. Cl.
*G06F 12/02* (2006.01)
*G06F 17/50* (2006.01)
*H01L 25/065* (2006.01)
*H05K 3/22* (2006.01)
*H05K 1/14* (2006.01)
*H03K 19/177* (2006.01)
*H05K 1/18* (2006.01)
*G06F 9/4401* (2018.01)
*G06F 9/445* (2018.01)
*G06F 15/78* (2006.01)
*H01L 25/16* (2006.01)

(52) U.S. Cl.
CPC ...... *G06F 9/44521* (2013.01); *G06F 12/0246* (2013.01); *G06F 15/7871* (2013.01); *H01L 25/0657* (2013.01); *H03K 19/17704* (2013.01); *H05K 1/144* (2013.01); *H05K 1/181* (2013.01); *H05K 3/222* (2013.01); *H01L 25/16* (2013.01); *H05K 2201/10515* (2013.01); *H05K 2201/10689* (2013.01)

(56) References Cited

U.S. PATENT DOCUMENTS

| | | | | |
|---|---|---|---|---|
| 8,856,757 | B2* | 10/2014 | Lei | G06F 9/44521 717/136 |
| 8,856,758 | B2* | 10/2014 | Lei | G06F 9/44521 717/136 |
| 9,152,182 | B1* | 10/2015 | McMahon | G06F 1/1658 |
| 9,268,742 | B2* | 2/2016 | Jogdand | G06F 17/10 |
| 9,424,019 | B2* | 8/2016 | Nightingale | G06F 8/65 |
| 9,698,793 | B1* | 7/2017 | Aden | G06F 12/0246 |
| 9,729,518 | B1* | 8/2017 | Atsatt | H04L 63/0428 |
| 2013/0232328 | A1* | 9/2013 | Johnson | G06F 8/60 713/2 |

* cited by examiner

US 10,031,993 B1

APPLICATION STORE MODEL FOR DYNAMIC RECONFIGURATION OF A FIELD-PROGRAMMABLE GATE ARRAY (FPGA)

TECHNICAL FIELD

Embodiments relate to configuration of computing devices, and in particular, to dynamic reconfiguration of a field-programmable gate array.

BACKGROUND

Field-programmable gate arrays (FPGAs) are computer processing circuits that are designed to be configured by a customer or a designer after manufacturing; hence, the term "field-programmable" is used. FPGAs include configurable logical blocks, data interconnects, and other programmable digital logic resources. An FPGA may be configured to perform various tasks typically performed by an application-specific integrated circuit (ASIC) or other fixed hardware resource. The FPGA configuration is generally specified using a hardware description language (HDL), similar to that used for an application-specific integrated circuit (ASIC).

FPGAs contain an array of programmable logic blocks, and a hierarchy of reconfigurable interconnects that allow the blocks to be "wired together," like many logic gates that can be inter-wired in different configurations. Logic blocks can be configured to perform complex combinational functions, or merely to provide functionality of simple logic gates like AND and XOR. In most FPGAs, logic blocks also include memory elements, which may be simple flip-flops or more complete blocks of memory.

As the size, capabilities, and speed of FPGAs has increased, FPGAs have been used to implement increased functionality to the point where some FPGAs are now marketed as full systems on chips (SoC). An FPGA has been used to implement a soft microprocessor, such as the Xilinx® MicroBlaze or Altera® Nios II. Particularly with the introduction of dedicated multipliers into FPGA architectures in the late 1990s, applications which had traditionally been the sole reserve of digital signal processors began to incorporate FPGAs instead. FPGAs are currently being used to accelerate hardware functionality, where the FPGA accelerates certain parts of an algorithm and shares part of the computation between the FPGA and a generic processor.

FPGAs have the following characteristics: high performance per watt per dollar, flexibility, upgradability, low development cost, and a migration path to lower cost as the application matures and usage increases. FPGAs are an important technology for implementing application acceleration ('accelerators') and virtual functions ('VF') on client and server class platforms. Network Function Virtualization (NFV) is an example of an industry trend toward consolidation of network 'boxes' on server class platforms with FPGA-based NFV integration. The emerging Internet of Things and 'smart' devices represent another class of platform that can take advantage of FPGA-based accelerators.

DETAILED DESCRIPTION

Figure 1:
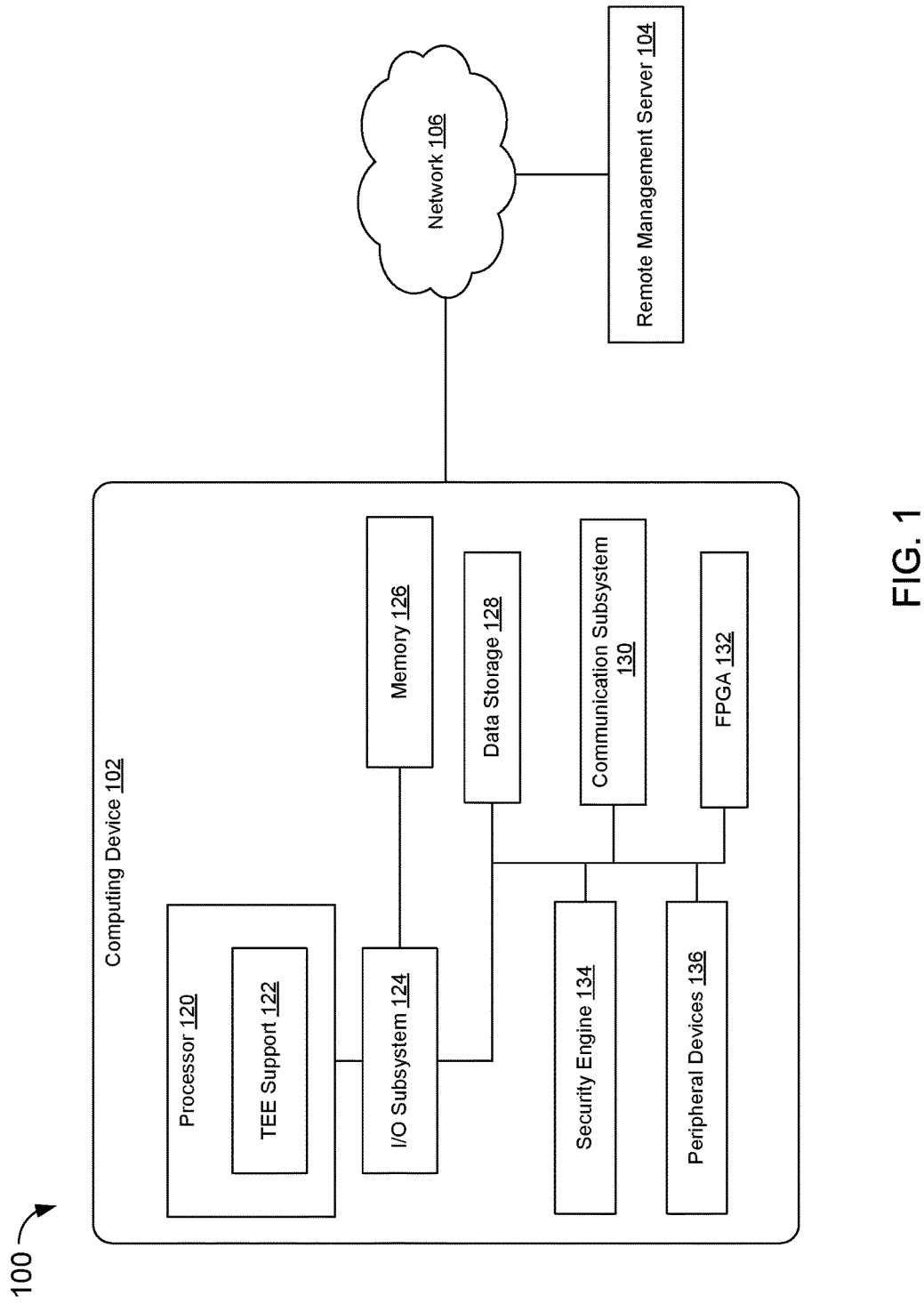
FIG. 1 is a block diagram of a computing device in which dynamic FPGA configuration may be performed.

An FPGA may be configured by installing an FPGA image. After being programmed with the FPGA image, the FPGA is capable of performing the hardware functions defined by the FPGA image. An FPGA image may be provided in different formats, such as a bitstream that can be directly loaded into the FPGA. Other types of FPGA image formats include a hardware description language program (e.g., a Very High Speed Integrated Circuit Hardware Definition Language (VHDL) program), Runtime Language (RTL) logic, or another type of module definition specified in a silicon-level programming language. A module definition in an FPGA image format other than a bitstream may be synthesized into a bitstream that can be directly executed by the FPGA. Synthesis of a module definition into a bitstream is a resource-intensive process that may be performed by a cloud service, on a server or other network device, or on the computing device including the FPGAs being reconfigured.

Because of the complexity of writing module definitions to accelerate functionality of an FPGA, FPGA image updates are typically written and provided by the FPGA manufacturer or a vendor with FPGA expertise. In a platform including heterogeneous FPGAs provided by different manufacturers, a user of the platform contacts each FPGA manufacturer or vendor individually to obtain the appropriate module definitions to provide the functionality desired and then undergoes a separate installation for each FPGA image upgrade. This manual FPGA image upgrade model sharply contrasts with the "application store" model with which most software users are familiar.

Presently, no ecosystem exists to encourage the software developer community to develop, share, sell, or host FPGA images or image updates. The present disclosure introduces an application store model for dynamic reconfiguration and acceleration of FPGA functionality. FPGA reconfiguration image updates can be provided as standalone images, or as "in-app" purchases available when an application is purchased, launched, or executing. This application store model enables a user to efficiently and dynamically reconfigure a given platform with heterogeneous/homogeneous FPGAs.

In one embodiment, an application store is presented to a user to enable the user to select a "RunTime Language (RTL) application," or "RTL App," also referred to herein as an "FPGA image update." The term "update" is used since an FPGA is installed initially with an original FPGA image. The application store may allow the user to select an FPGA image update/RTL App for a specific FPGA on a platform, where the FPGA image updates are presented to the user for all FPGAs present for a specific platform stock keeping unit (SKU). In one embodiment, the application store is configured to allow the user to place the selected FPGA image update/RTL App into a "shopping cart" and then to "install" the FPGA image update (similar to installation of a software application). An in-app purchase is also possible, where the user is allowed to purchase an FPGA image update during execution of an application using the FPGA.

Enabling a user to purchase and install FPGA image updates for heterogeneous FPGAs on a given platform provides a licensing challenge for the proposed application store model. In one embodiment, a license manager, referred to herein as "license manager logic," issues a license for a specific FPGA image update to be installed on a particular FPGA or group of FPGAs within an "FPGA cluster" of a platform. The license may be valid for a specified length of time or until a specified "licensing event" occurs, such as removing the particular FPGA from the platform. The term "soft SKU" is used to refer to a dynamically configurable FPGA capability within a specific platform SKU.

The proposed application store model provides the abilities to efficiently discover and manage FPGA image updates/RTL Apps. To achieve this, the FPGA technology and methods for exposing the FPGA capabilities are reinvented to package FPGA images into "installable," "bootable," "discoverable," and "callable" objects.

The proposed application store model uses several features of a computing platform to enable FPGAs of the platform to be dynamically configured. For example, a manageability engine of the computing device may verify and install reconfigurable FPGA image logic as part of a secure boot process at run-time. In one embodiment, the manageability engine notifies system software (e.g., Unified Extensible Firmware Interface Basic Input/Output Software (UEFI BIOS)) of the computing device via a dedicated out-of-band communication channel (bypassing a processor and operating system of the computing device) about new FPGA image update logic for a specific FPGA module within the computing device platform.

System software (e.g., UEFI BIOS) of the computing device may also perform dynamic runtime discovery of newly-installed FPGA image updates and provide notification (e.g., soft hot-plug) to an operating system or virtual machine monitor (OS/VMM) of the computing device. In one embodiment, the OS/VMM of the computing device is notified of newly-installed FPGA image updates via OS/VMM authenticated variables. In response to receiving a notification of a newly-installed FPGA image update, the OS/VMM may update internal data structures for newly-discovered FPGA capabilities and expose the newly-installed FPGA image updates as callable objects to other elements of the software stack of the computing device, such as frameworks and applications.

In one embodiment, an update to a reconfigurable FPGA image is installed at runtime without rebooting the computing device. The operating system is notified of the update to the reconfigurable FPGA image at runtime, and the selected upgradable capability of the FPGA is exposed to at least one component of the software stack at runtime. After installation of the update to the FPGA reconfigurable image and exposure of the selected upgradable capability of the FPGA to components of the software stack, the components of the software stack are enabled to use the upgraded capabilities of the FPGA without rebooting the computing device.

In one embodiment, the operating system exposes the selected upgradable capability of the FPGA by configuring an OS driver or library that is used for dynamic linking to an application. The application dynamically acquires new functionality or achieves improved performance subsequent to enablement of the selected upgradable capability of the FPGA, at runtime and without reboot of the computing device.

In one embodiment, a virtual machine monitor manages execution of processes on the computing device, and the software stack of the computing device may include at least two guest virtual machines. The virtual machine monitor may expose the selected upgradable capability of the FPGA to only one of the guest virtual machines and not to the other guest virtual machine. For example, a user of a first guest virtual machine may select to upgrade an FPGA capability and accept a license for the upgraded FPGA capability, whereas another user of a second guest virtual machine may choose not to upgrade FPGA capabilities. The virtual machine monitor is to expose the selected upgradable capability of the FPGA only to the first virtual machine and not to the second guest virtual machine. Consequently, the first guest virtual machine is enabled to use the selected upgradable capability of the FPGA, while the second guest virtual machine is unable to use the selected upgradable capability of the FPGA.

The application store model described herein enables a user of a computing device to search for upgradable capabilities for FPGAs within the computing device, install FPGA image updates, and dynamically reconfigure FPGAs in a heterogeneous access point topology (within a CPU, within a CPU package, in peripherals such as a Peripheral Component Interconnect Express (PCIe) slot, etc.).

Referring now to FIG. 1, in an illustrative embodiment, a system 100 to provide an application store for FPGA reconfiguration includes a computing device 102 with a processor 120 and an FPGA 132. The system 100 may also include a remote management server 104 in communication with the computing device 102 via a network 106. In use, the computing device 102 enables a user to dynamically reconfigure an FPGA, such as FPGA 132, to provide additional or different (e.g., accelerated) functionality.

Additionally, although illustrated as including a single computing device 102 and remote management server 104, it should be understood that in some embodiments the system 100 may include any number of computing devices 102 and/or remote management servers 104. The system 100 allows for FPGA images to be dynamically installed without the need to reboot the computing device 102. Additionally, the system 100 also may allow policy-based selection of FPGA images, for example, such as allowing different FPGA images to be used for different device contexts.

The computing device 102 may be embodied as any type of computation or computer device capable of performing the functions described herein, including, without limitation, a computer, a desktop computer, a workstation, a server, a laptop computer, a notebook computer, a tablet computer, a mobile computing device, a wearable computing device, a network appliance, a web appliance, a distributed computing system, a processor-based system, and/or a consumer electronic device. As shown in FIG. 1, the computing device 102 illustratively includes a processor 120, an input/output subsystem 124, a memory 126, a data storage device 128, and a communication subsystem 130. Of course, the computing device 102 may include other or additional components, such as those commonly found in a desktop computer (e.g., various input/output devices), in other embodiments. Additionally, in some embodiments, one or more of the illustrative components may be incorporated in, or otherwise form a portion of, another component. For example, the memory 126, or portions thereof, may be incorporated in the processor 120 in some embodiments.

The processor 120 may be embodied as any type of processor capable of performing the functions described herein. The processor 120 may be embodied as a single or multi-core processor(s), digital signal processor, microcontroller, or other processor or processing/controlling circuit. As shown, the processor 120 includes Trusted Execution Environment (TEE) support 122, which allows the processor 120 to establish a trusted execution environment. In one embodiment, a trusted execution environment known as a secure enclave may be established, in which executing code may be measured, verified, and/or otherwise determined to be authentic. Additionally, code and data included in the trusted execution environment may be encrypted or otherwise protected from being accessed by code executing outside of the trusted execution environment. For example, code and data included in the trusted execution environment may be protected by hardware protection mechanisms of the processor 120 while being executed or while being stored in certain protected cache memory of the processor 120. The code and data included in the trusted execution environment may be encrypted when stored in a shared cache or the main memory 126. Trusted execution environment (TEE) support 122 may be embodied as a set of processor instruction extensions that allows the processor 120 to establish one or more secure enclaves in the memory 126. For example, trusted execution environment (TEE) support 122 may be embodied as Intel® Software Guard Extensions (SGX) technology.

The memory 126 may be embodied as any type of volatile or non-volatile memory or data storage capable of performing the functions described herein. In operation, the memory 126 may store various data and software used during operation of the computing device 102 such as operating systems, applications, programs, libraries, and drivers. Additionally, part of the memory 126 may be used as an enclave page cache (EPC) to store encrypted code and/or data for trusted execution environments implemented as secure enclaves established by the processor 120. The processor 120 may encrypt memory pages of each secure enclave before transferring the encrypted pages out of the processor 120 to the EPC within the memory 126.

The memory 126 is communicatively coupled to the processor 120 via the I/O subsystem 124, which may be embodied as circuitry/logic and/or components to facilitate input/output operations with the processor 120, the memory 126, and other components of the computing device 102. For example, the I/O subsystem 124 may be embodied as, or otherwise include, memory controller hubs, input/output control hubs, platform controller hubs, integrated control circuitry/logic, firmware devices, communication links (i.e., point-to-point links, bus links, wires, cables, light guides, printed circuit board traces, etc.) and/or other components and subsystems to facilitate the input/output operations. In some embodiments, the I/O subsystem 124 may form a portion of a system-on-a-chip (SoC) and be incorporated, along with the processor 120, the memory 126, the FPGA 132, and other components of the computing device 102, on a single integrated circuit chip.

The data storage device 128 may be embodied as any type of device or devices configured for short-term or long-term storage of data such as, for example, memory devices and circuits, memory cards, hard disk drives, solid-state drives, or other data storage devices. In some embodiments, the data storage device 128 may be used to store one or more executable binary images, firmware images, and/or FPGA images.

The communication subsystem 130 of the computing device 102 may be embodied as any communication circuit, device, or collection thereof, capable of enabling communications between the computing device 102 and other remote devices over a network. The communication subsystem 130 may be configured to use any one or more communication technology (e.g., wired or wireless communications) and associated protocols (e.g., Ethernet, Bluetooth®, Wi-Fi®, WiMAX, etc.) to effect such communication.

As described above, the computing device 102 includes an FPGA 132. The FPGA 132 may be embodied as an integrated circuit including programmable digital logic resources that may be configured after manufacture, for example by a system integrator or an end user. The FPGA 132 may include, for example, a configurable array of logic blocks in communication over a configurable data interchange. The FPGA 132 may access data stored in the memory 126, for example using a local buffer of the FPGA 132. Additionally or alternatively, in some embodiments the FPGA 132 may also include dedicated, secure non-volatile memory (e.g., flash memory) that may be used as secure storage. Although illustrated in FIG. 1 as a discrete component separate from the processor 120 and/or the I/O subsystem 124, it should be understood that in some embodiments one or more of the FPGA 132, the processor 120, the I/O subsystem 124, and/or the memory 126 may be incorporated in the same package and/or in the same computer chip, for example in the same system-on-a-chip (SoC).

As shown, the computing device 102 may also include a security engine 134 and one or more peripheral devices 136. Security engine 134 may be embodied as any hardware component(s) or circuitry/logic capable of providing manageability and security-related services to the computing device 102, such as a Converged Security and Manageability Engine (CSME) provided by Intel®. In particular, security engine 134 may include a microprocessor, microcontroller, or other embedded controller capable of executing firmware and/or other code independently and securely from the processor 120. Thus, security engine may be used to establish a trusted execution environment for the computing device 102. Security engine 134 may communicate with the processor 120 and/or other components of the computing device 102 over a dedicated bus, such as a host embedded controller interface (HECI). Security engine 134 may also provide remote configuration, control, or management of the computing device 102.

Further, in some embodiments, security engine 134 is also capable of communicating using the communication subsystem 130 or a dedicated communication circuit independently of the state of the computing device 102 (e.g., independently of the state of the main processor 120), also known as "out-of-band" communication. Security engine 134 may be incorporated in a system-on-a-chip (SoC) of the computing device 102; however, in some embodiments, the computing device 102 may include one or more additional components capable of establishing a trusted execution environment, such as an out-of-band processor, a Trusted Platform Module (TPM), and/or another security engine device or collection of devices.

The peripheral devices 136 may include any number of additional input/output devices, interface devices, and/or other peripheral devices. For example, in some embodiments, the peripheral devices 136 may include a display, touch screen, graphics circuitry, keyboard, mouse, speaker system, microphone, network interface, and/or other input/output devices and interface devices. In addition, a given peripheral device may include an FPGA.

The remote management server 104 may be embodied as any type of computation or computer device capable of performing the functions described herein, including, without limitation, a computer, a multiprocessor system, a server, a rack-mounted server, a blade server, a network appliance, a distributed computing system, a processor-based system, and/or a consumer electronic device. As such, the remote management server 104 may be embodied as a single server computing device or a collection of servers and associated devices. For example, in some embodiments, the remote management server 104 may be embodied as a "virtual server" formed from multiple computing devices distributed across the network 106 and operating in a public or private cloud. Accordingly, although the remote management server 104 is illustrated in FIG. 1 and described below as embodied as a single server computing device, it should be appreciated that the remote management server 104 may be embodied as multiple devices cooperating together to facilitate the functionality described below. The remote management server 104 may include a processor, an I/O subsystem, a memory, a data storage device, a communication subsystem, and/or other components and devices commonly found in a server or similar computing device. Those individual components of the remote management server 104 may be similar to the corresponding components of the computing device 102, the description of which is applicable to the corresponding components of the remote management server 104 and is not repeated herein so as not to obscure the present disclosure.

As discussed in more detail below, the computing device 102 and the remote management server 104 may be configured to transmit and receive data with each other and/or other devices of the system 100 over the network 106. The network 106 may be embodied as any number of various wired and/or wireless networks. For example, the network 106 may be embodied as, or otherwise include, a wired or wireless local area network (LAN), a wired or wireless wide area network (WAN), a cellular network, and/or a publicly-accessible, global network such as the Internet or RF network. As such, the network 106 may include any number of additional devices, such as additional computers, routers, and switches, to facilitate communications among the devices of the system 100.

Figure 2:
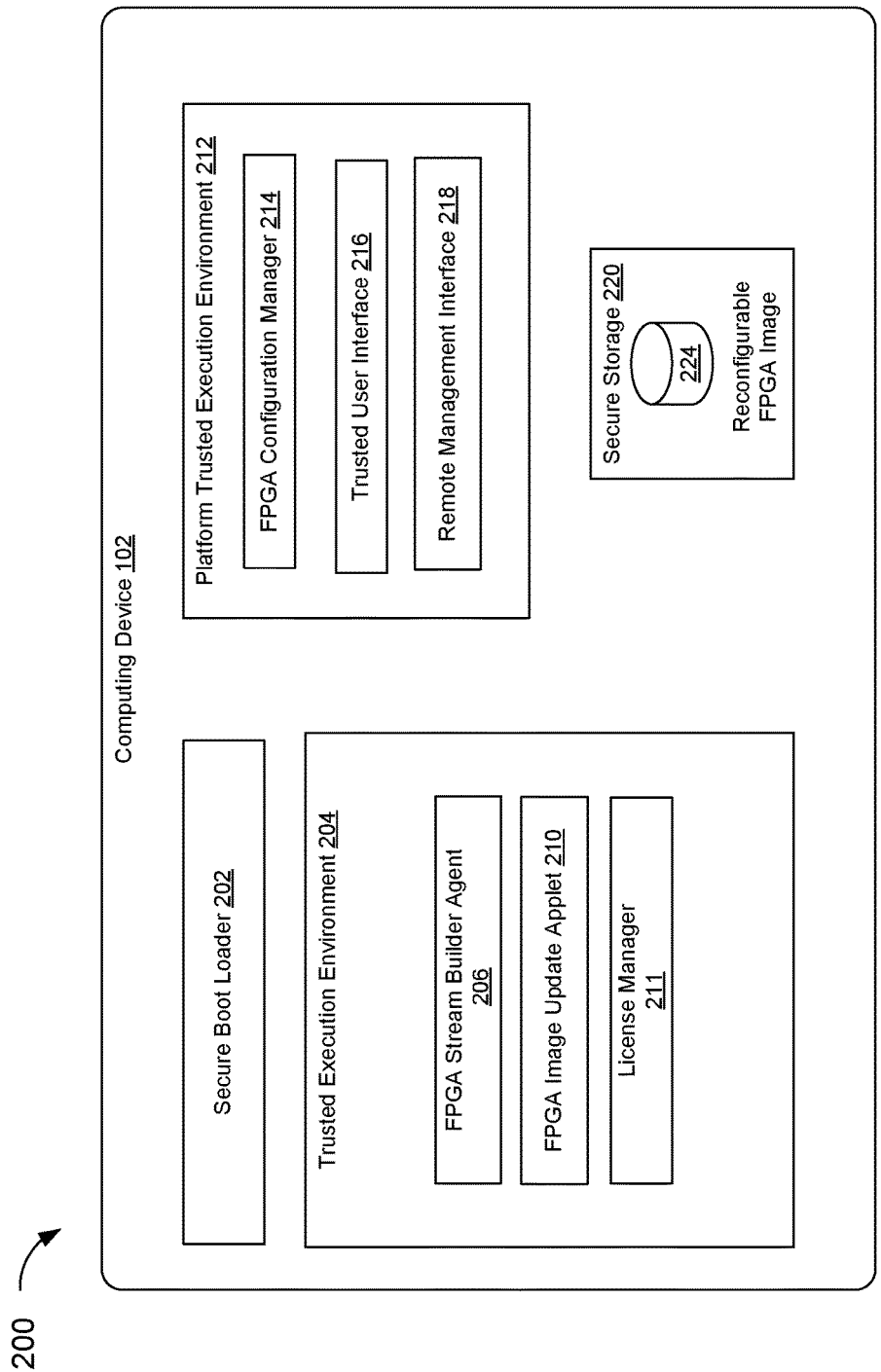
FIG. 2 is a block diagram of an environment created during execution of the computing device of FIG. 1.

Referring now to FIG. 2, in an illustrative embodiment, the computing device 102 establishes an environment 200 during operation. The illustrative environment 200 includes a secure boot loader 202, a trusted execution environment 204, a platform trusted execution environment 212, and secure storage 220. The trusted execution environment 204 includes an FPGA stream builder agent 206, an FPGA image update applet 210 and a license manager 211.

In one embodiment, FPGA stream builder agent 206 causes runtime logic for an upgradable capability of an FPGA to be synthesized into a binary form, referred to herein as a bitstream. FPGA stream builder agent 206 may synthesize the bitstream directly using resources of computing platform 102, or FPGA stream builder agent 206 may use a service (not shown) provided by a server platform, such as server platform 104 of FIG. 1, to synthesize the bitstream.

FPGA image update applet 210 is shown within trusted execution environment 204 and interfaces directly with secure storage 220, which includes reconfigurable FPGA image 224. FPGA image update applet 210 manages the installation of reconfigurable FPGA images on FPGAs of computing device 102, such as FPGA 132 of FIG. 1.

Reconfigurable FPGA images may be installed on a given FPGA at system boot time, at application launch time for an application using capabilities of the FPGA, or during a process or virtual machine (VM) context switch from one process or virtual machine to another during runtime.

License manager 211 is configured to issue a license to enable a selected upgradable capability of the FPGA in exchange for acceptance of the license by the user. In response to issuance of the license by license manager 211, FPGA image update applet 210 may obtain an update to a reconfigurable FPGA image 224 of a given FPGA.

The platform trusted execution environment 212 includes an FPGA configuration manager 214, a trusted user interface 216, and a remote management interface 218. FPGA configuration manager 214 interacts with FPGA image update applet 210 to reconfigure FPGAs of computing device 102 to provide additional or different (e.g., accelerated) functionality. Trusted user interface 216 enables a user to select an upgradable capability of an FPGA of computing device 102. Remote management interface 218 interacts with a server such as server 104 of FIG. 1 to manage computing devices such as computing device 102.

The various components of the environment 200 may be embodied as hardware, firmware, software, or a combination thereof. As such, in some embodiments, one or more of the components of the environment 200 may be embodied as circuitry/logic or a collection of electrical devices (e.g., secure boot loader circuitry/logic 202, FPGA stream builder agent circuitry/logic 206, FPGA image update applet circuitry/logic 210, license manager circuitry/logic 211, FPGA configuration manager circuitry/logic 214, trusted user interface circuitry/logic 216, and/or remote management interface circuitry/logic 218). It should be appreciated that, in such embodiments, one or more of secure boot loader circuitry/logic 202, FPGA stream builder agent circuitry/logic 206, FPGA image update applet circuitry/logic 210, license manager circuitry/logic 211, FPGA configuration manager circuitry/logic 214, trusted user interface circuitry/logic 216, and/or remote management interface circuitry/logic 218 may form a portion of one or more of the processor 120, the I/O subsystem 124, the FPGA 132, the security engine 134, and/or other components of the computing device 102 shown in FIG. 1. Additionally, in some embodiments, one or more of the illustrative components may form a portion of another component and/or one or more of the illustrative components may be independent of one another.

The secure boot loader 202 is configured to start a secure boot process to establish a chain of trust. A chain of trust is established by validating each layer of hardware, firmware and software, beginning with the hardware and iteratively validating each firmware and software component that is loaded into memory. The chain of trust begins with a trust anchor, such as the hardware of the computing system, which can be trusted because the hardware will only boot from firmware or software that is digitally signed.

The signing authority for firmware and/or software typically will only sign boot programs that enforce security, such as only running programs that are themselves signed, or only allowing signed code to have access to certain features of the computing system. The establishment of a chain of trust may continue through several software layers. Each component of a computer system assumes trust of its predecessor component (i−1) and measures the integrity of its successor component (i+1) before relinquishing control to the successor component. This process repeats iteratively until all components of the computer system's code base are trusted.

In environment 200 of FIG. 2, the chain of trust for computing device 102 includes the trusted execution environment 204 of the computing device 102. The secure boot process may be embodied as Intel® Trusted Execution Technology (TXT) or other secure boot technology.

In one embodiment, secure boot loader 202 measures firmware, software and/or FPGA images used to configure computing device 102. For example, secure boot loader 202 may measure a reconfigurable FPGA image 224 used to initially configure an FPGA at boot time. FPGA image 224 may be measured, for example, by calculating a cryptographic hash value of the FPGA image 224. Secure boot loader 202 verifies the FPGA image 224 by comparing the calculated measurement with a corresponding whitelist measurement.

Secure boot loader 202 may also measure the firmware or software that installs updates to the reconfigurable FPGA image, such as FPGA image update applet 210. FPGA image update applet 210 may be measured, for example, by calculating a cryptographic hash value of the FPGA image update applet 210. Secure boot loader 202 verifies the FPGA image update applet 210 by comparing the calculated measurement with a corresponding whitelist measurement.

The corresponding whitelist measurement for a given firmware, software, or FPGA image may be obtained, for example, from a remote management server such as remote management server 104 of FIG. 1. If the calculated measurement for the given firmware, software, or FPGA image matches the whitelist measurement, secure boot loader 202 may save the verified measurement into an integrity register such as a Trusted Platform Module (TPM) Platform Configuration Register (PCR). The verified measurement may be retrieved from the integrity register and used to verify that the firmware, software, and/or FPGA image has not been subject to tampering. In another embodiment, secure boot loader 202 may contribute the verified measurement to a blockchain, where the verified measurement becomes an entry in a distributed log of measured "blocks." The verified measurement may be retrieved from the blockchain and used to verify that the firmware, software, and/or FPGA image has not been subject to tampering.

The trusted execution environment 204 may be embodied as any isolated and secure execution environment within the environment 200. Code and/or data accessed by the trusted execution environment 204 may be validated and protected from unauthorized access and/or modification. Additionally, the trusted execution environment 204 has access to the secure storage 220. In the illustrative embodiment, the trusted execution environment 204 may be provided by the FPGA 132 or the security engine 134 of FIG. 1, each of which may provide a secure execution environment that is independent from the processor 120 of the computing device 102. Additionally or alternatively, in other embodiments, the trusted execution environment 204 may be provided with a secure enclave or other secure software environment such as an Intel® SGX secure enclave, an ARM® TrustZone® secure world, or other secure environment.

In an embodiment in which the trusted execution environment is provided by a given FPGA, the trusted execution environment 204 can be implemented in a dedicated processing environment within the FPGA logic elements. For example, an FPGA IP block may integrate a general purpose microprocessor such as an ARM® or Intel® core that has exclusive access to the resources of the given FPGA. This microprocessor may host an embedded operating system and applications to implement the trusted execution environment 204. Logic elements within the given FPGA may also be used to store FPGA reconfigurable images, as well as to store code that measures the FPGA reconfigurable images and code that measures the FPGA image update logic that installs updates to the FPGA reconfigurable images. These code measurements may be performed during a secure boot of the computing device.

As shown, the trusted execution environment 204 includes the FPGA image update applet 210.

The FPGA image update applet 210 is configured to load an FPGA image 224 stored in the secure storage 220 of the computing device 102 in response to a request to configure a given FPGA. Requests to configure (or reconfigure) an FPGA may be received from, for example, FPGA configuration manager 214. Requests to configure (or reconfigure) an FPGA may be received at system boot time for computing device 102, at application launch time for an application using the capabilities of an FPGA of computing device 102, or during a process or virtual machine context switch by a process manager/virtual machine manager that manages a workload using the capabilities of an FPGA of computing device 102.

The FPGA image 224 may include a bitstream, VHDL program, RTL logic, or any other module definition for a given FPGA to be configured. For example, the FPGA image 224 may be used to configure the FPGA to perform the functions of a bus controller, an input/output (I/O) controller, an embedded controller, or other functions typically performed by an ASIC, microcontroller, or other hardware component of the computing device 102. By configuring FPGAs to perform the functions of such controllers, these controllers may be upgraded to achieve accelerated performance and/or enhanced functionality. Such performance and functionality upgrades are not possible with current licensing schemes.

Before configuring the given FPGA, the FPGA image update applet 210 may confirm that a license for FPGA image 224 has been issued for the given FPGA. The FPGA image update applet 210 may be further configured to provision, by the trusted execution environment 204, the FPGA image 224 to the secure storage 220. The FPGA image 224 may be received by the trusted execution environment 204 from a remote computing device. In some embodiments, the functions of the FPGA image update applet 210 may be performed by one or more sub-components.

Similar to the trusted execution environment 204, the platform trusted execution environment 212 may also be embodied as any isolated and secure execution environment within the environment 200. Code and/or data accessed by the platform trusted execution environment 212 may be validated and protected from unauthorized access and/or modification. Additionally, the platform trusted execution environment 212 may have access to the secure storage 220. In the illustrative embodiment, the platform trusted execution environment 212 may be provided by the security engine 134 of FIG. 1, which provides a secure execution environment that is independent from the processor 120 of the computing device 102. Additionally or alternatively, in other embodiments the platform trusted execution environment 212 may be provided with a secure enclave or other secure software environment such as an Intel SGX secure enclave, an ARM® TrustZone® secure world, or other secure environment. In some embodiments, the platform trusted execution environment 212 and the trusted execution environment 204 may be established by the same component (e.g., the security engine 134). As shown, the platform trusted execution environment 212 includes the FPGA configuration manager 214, the trusted user interface 216, and the remote management interface 218.

FPGA configuration manager 214 manages the configuration of FPGAs of computing device 102. In one embodiment, the FPGA configuration manager 214 is configured to verify the FPGA image 224. In one embodiment, FPGA configuration manager 214 verifies FPGA image 224 by obtaining an expected hash value for FPGA image 224 from secure storage 220 and/or an integrity register, calculating a current hash value from FPGA image 224, and comparing the expected hash value to the current hash value. If the expected hash value equals the current hash value, FPGA configuration manager 214 verifies FPGA image 224. In another embodiment, FPGA configuration manager 214 obtains a whitelisted measurement for FPGA image 224 from a management server, such as remote management server 104 of FIG. 1. A measurement is calculated for FPGA image 224 and compared to the whitelisted measurement. If the measurements match, FPGA configuration manager 214 verifies FPGA image 224.

The trusted user interface 216 is configured to cause available platform FPGAs and upgradable capabilities of the platform FPGAs to be displayed to a user of the computing device. The trusted user interface 216 is further configured to receive a selection of an upgradable capability of a selected FPGA and an acceptance of a license from the user.

The remote management interface 218 is configured to receive, by the platform trusted execution environment 212, data such as an update to FPGA image 224 from the remote management server 104 via an out-of-band network connection.

Figure 3:
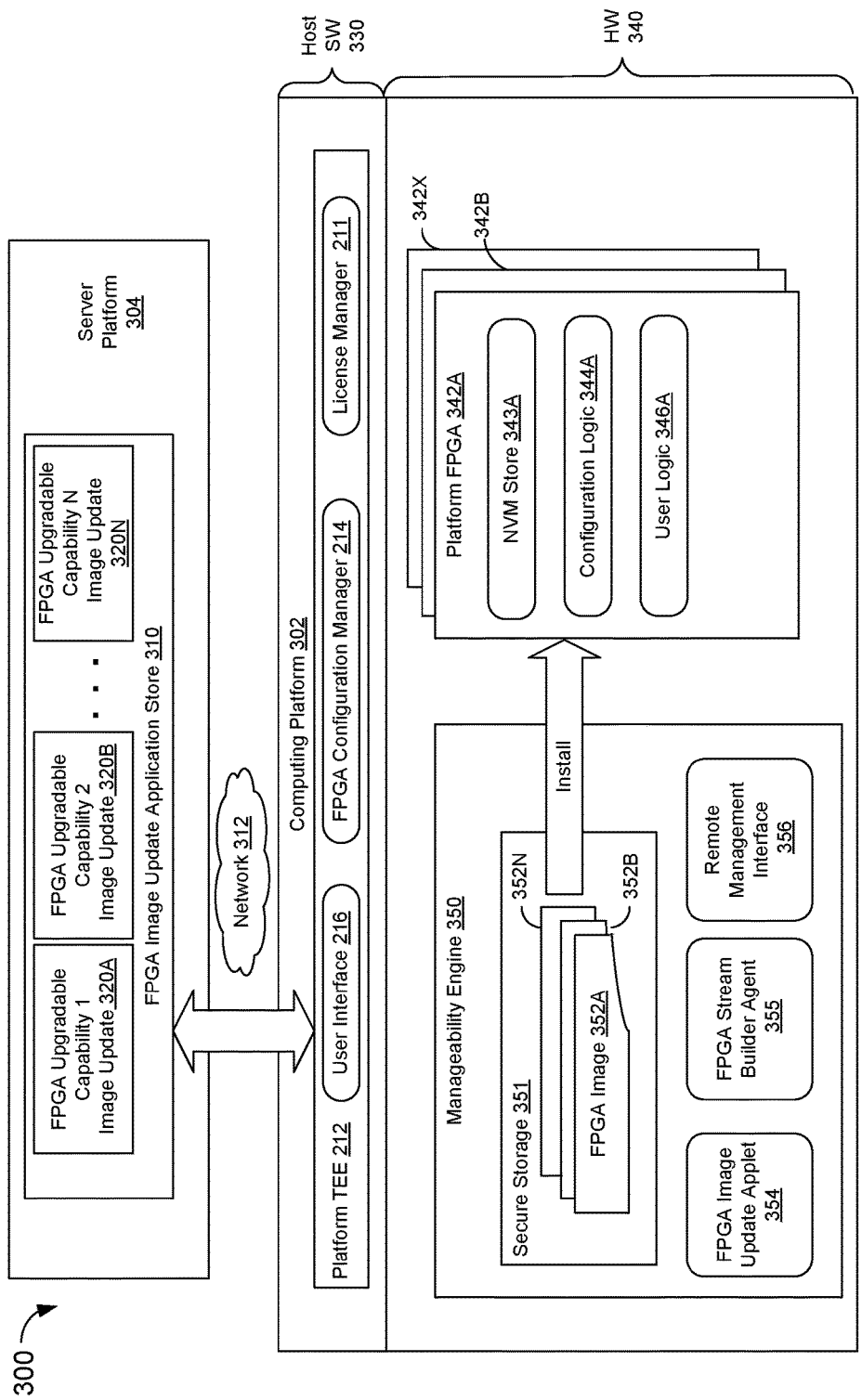
FIG. 3 is a block diagram of a system for providing an application store to dynamically reconfigure FPGAs of a computing platform.

FIG. 3 shows an environment in which an FPGA image update application store provides user-selectable FPGA image updates to implement a set of FPGA upgradable capabilities. Environment 300 includes computing platform 302 and server platform 304, which communicate via network 312. On server platform 304, FPGA image update application store 310 provides user-selectable FPGA image updates 320A through 320N, where each image update corresponds to an FPGA upgradable capability 1 through N. Server platform 304 may communicate with computing platform 302 via a remote management interface 356 of manageability engine 350.

Computing platform 302 includes host software 330 and hardware 340. Host software 330 includes a user interface 216, an FPGA configuration manager 214 and a license manager 211 running within a platform trusted execution environment 212. Although it is not a requirement that FPGA configuration manager 214 runs within a platform trusted execution environment, an owner of computing platform 302 may wish to provide additional protection against an adversary seeking to reconfigure an FPGA for malicious purposes.

Hardware 340 includes platform FPGAs 342A through 342X. While each of the FPGAs 342A through 342X is shown as a discrete standalone FPGA, one of skill in the art will recognize that the techniques described herein are equally applicable to FPGAs included within or attached to another device. Each of the platform FPGAs 342A through 342X includes a respective non-volatile memory (NVM) store, configuration logic, and user logic. For example, platform FPGA 342A includes NVM store 343A, configuration logic 344A, and user logic 346A.

Configuration logic 344A may operate at system start-up to configure FPGA 342A to provide the functionality defined by a respective FPGA image. Configuration logic 344A may also operate at runtime to obtain an update to the respective FPGA image and reconfigure FPGA 342A to provide additional or different functionality. User logic 346A may be used to configure platform FPGA 342A to provide user-specific functionality to a user of computing platform 302. While configuration logic 344A and user logic 346A are shown as separate modules, a single module may perform the functions of configuration logic 344A and user logic 346A. Alternatively, a separate module may be used to initially configure an FPGA image and another module may be used to reconfigure the FPGA at runtime.

Hardware 340 of computing platform 302 also includes a manageability engine 350, which includes secure storage 351. Secure storage 351 is used by manageability engine 350 to store FPGA images 352A through 352N. Manageability engine 350 also includes FPGA image update applet 354, FPGA stream builder agent 355, and remote management interface 356.

FPGA image update applet 354 works at the hardware 340 level in conjunction with FPGA configuration manager 214 at the host software 330 level. FPGA image update applet 354 manages the FPGA images 352A through 352N and provides respective FPGA images to be installed on platform FPGAs 342A through 342X. Once an FPGA image is installed on a respective platform FPGA, the FPGA can implement functionality defined by the FPGA image. For example, installation of FPGA image 352N on platform FPGA 342A causes configuration logic 344A to configure and/or enable the capabilities specified by the FPGA image 352N on FPGA 342A.

A non-volatile memory store, such as NVM store 343A, can be used by platform FPGA 342A to store data. For example, NVM store 343A may store an initial FPGA image to be used by configuration logic 344A to initialize FPGA 342A at system start-up.

In one embodiment, FPGA image update application store 310 of server platform 304 works in conjunction with FPGA configuration manager 214 on computing platform 302 to customize the FPGA upgradable capabilities that are selectable from FPGA image update application store 310. For example, FPGA configuration manager 214 may obtain information regarding the existing capabilities of platform FPGAs 342A through 342X via FPGA image update applet 354. FPGA configuration manager 214 and/or FPGA image update applet 354 may provide information regarding the existing capabilities of computing platform 302 to FPGA image update application store 310, which may then determine which of the existing capabilities of computing platform 302 are upgradable and have available image updates. Image updates that correspond to the identified upgradable capabilities of computing platform 302 may then be presented by FPGA image update application store 310 to a user of computing platform 302 for selection.

Figure 4:
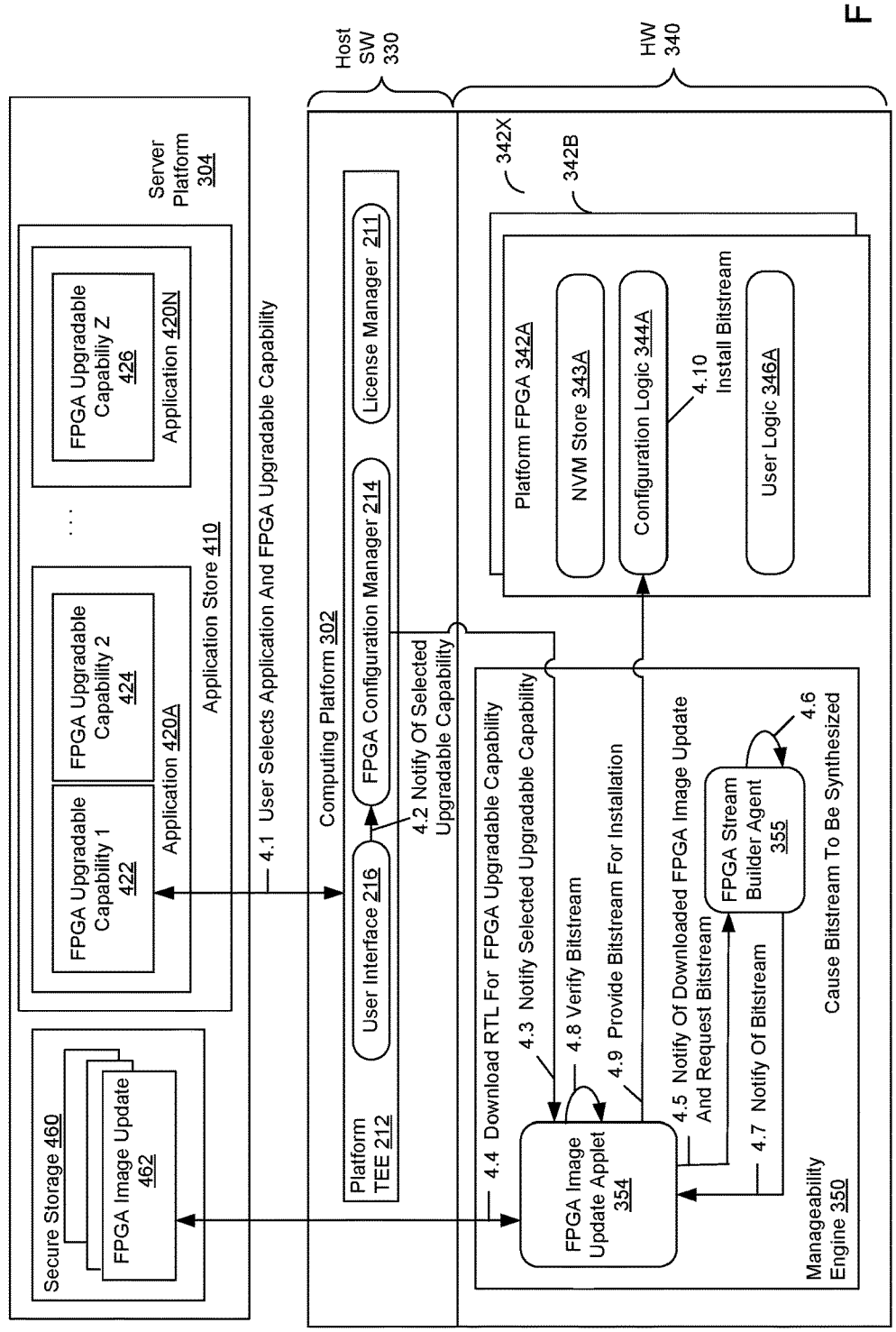
FIG. 4 is a block diagram of another embodiment of the system of FIG. 3 to dynamically reconfigure FPGAs of a computing platform.

Referring to FIG. 4, another illustrative embodiment of an application store 410 providing image updates for FPGAs 342A through 342X is shown. In this example, the user is presented with applications from which to select, and then FPGA upgradable capabilities are presented within the context of the selected application. For example, application store 410 may offer applications 420A through 420N for purchase. When the user selects an application such as application 420A for purchase, application store 410 may present FPGA upgradable capabilities 420A-1 and 420A-2 in the context of the selected application 420A. The user may then select either or both of FPGA upgradable capabilities 420A-1 and 420A-2 to work in conjunction with the selected application 420A.

In action 4.1, a user of computing platform 302 uses user interface 216 to select an application 420A and an associated FPGA upgradable capability 422. User interface 216 may be implemented via a web browser and application store 410 may be implemented as a web page accessible via user interface 216. Although not shown in FIG. 4, the user may accept a license for FPGA upgradable capability 422 provided by license manager 211 via user interface 216 and submit a payment for the license. In one embodiment, the license authorizes enabling the selected upgradable FPGA capability until occurrence of a license expiration event. A license may expire after a specified period of time, in response to a user request to continue the license, or in response to a system reboot or reconfiguration. For example, a user may choose to accelerate functionality of given FPGA for a period of hours or days. Upon occurrence of the license expiration event, the license manager 211 may work with FPGA configuration manager 214 to cause the selected upgradable FPGA capability to be disabled.

In action 4.2, user interface 216 notifies FPGA configuration manager 214 of the user's selected FPGA upgradable capability 422. In action 4.3, FPGA configuration manager 214 notifies FPGA image update applet 354 within manageability engine 350 of the user's selected FPGA upgradable capability 422. In action 4.4, FPGA image update applet 354 downloads an FPGA image update 462 to implement the user's selected FPGA upgradable capability 422. FPGA image update 462 may be RunTime Language logic, or FPGA image update 462 may be a pre-synthesized bitstream.

In action 4.5, FPGA image update applet 354 notifies FPGA stream builder agent 355 that FPGA image update 462 has been downloaded. In the embodiment shown, FPGA image update 462 is in the form of RunTime Language logic, so FPGA image update applet 354 requests FPGA stream builder agent 355 to synthesize a bitstream from FPGA image update 462. In action 4.6, FPGA stream builder agent 355 causes a bitstream to be generated from FPGA image update 462. In the example shown in FIG. 4, FPGA stream builder agent 355 synthesizes FPGA image update 462 using resources of platform 302 to create a bitstream. In other embodiments, FPGA stream builder agent 355 may work in conjunction with an RTL synthesis cloud service performed on server platform 304 or elsewhere in the cloud.

In action 4.7, FPGA stream builder agent 355 notifies FPGA image update applet 354 that a bitstream has been synthesized. Although not shown in FIG. 4, FPGA image stream builder agent 355 may identify a location in which the bitstream is stored for use by FPGA image update applet 354. FPGA image update applet 354 may retrieve the synthesized bitstream from a location identified by FPGA stream builder agent 355. For example, the bitstream may be stored in a secure storage, such as secure storage 220 of FIG. 2. The secure storage may be managed by FPGA image update applet 354 within manageability engine 350.

In action 4.8, FPGA image update applet 354 verifies the bitstream synthesized from FPGA image update 462. FPGA image update applet 354 identifies a target FPGA on computing platform 302, FPGA 342A, which can be upgraded to provide the functionality of upgradable capability 422. FPGA image update applet 354 may verify the synthesized bitstream by measuring the synthesized bitstream and comparing the calculated measurement to a whitelisted measurement for the FPGA bitstream. The whitelisted measurement may be obtained, for example, from server platform 304 or from a measurement cloud service elsewhere in the cloud. In action 4.9, FPGA image update applet 354 provides the bitstream to FPGA 342A for installation. In action 4.10, configuration logic 344A reconfigures FPGA 342A by installing the bitstream to provide upgradable capability 422 for application 420A running on computing platform 302.

In one embodiment, FPGA configuration manager 214 and/or FPGA image update applet 354 updates an inventory of FPGA capabilities for the computing device, such as by setting a register value, to indicate that the selected upgradable FPGA capability is currently valid (i.e., licensed and enabled). In another embodiment, FPGA configuration manager 214 and/or FPGA image update applet 354 records a transaction for the issuance of the license and enablement of the selected upgradable FPGA capability. FPGA configuration manager 214 and/or FPGA image update applet 354 may provide the transaction for auditing against a transaction log of licensed and enabled FPGA upgradable capabilities for the computing device. The transaction log may be maintained, for example, by a provider of the FPGA image update.

The Application Store 410 of FIG. 4 and the FPGA Image Update Application Store 310 of FIG. 3 enable the selection of image updates for the platform FPGAs 342A through 342X. In one embodiment, the application store offers for purchase a single "FPGA application" that may be synthesized into bitstreams to run on multiple devices. For example, a single "FPGA application" may provide accelerated graphics functionality for multiple platforms, including a laptop computing device, a tablet, and a mobile phone. The FPGAs providing graphics functionality for each of these platforms may be configured differently, although some common portions of the FPGA image update for each platform may be shared. The application store may provide the user with pre-synthesized bitstreams for the common FPGA image portions, and RunTime Language logic for the portions of the FPGA image update that are particular to each platform.

These upgradable FPGAs may exist at various heterogeneous attach point configurations in a given platform. Examples of attach point configurations are shown in FIG. 5.

Figure 5:
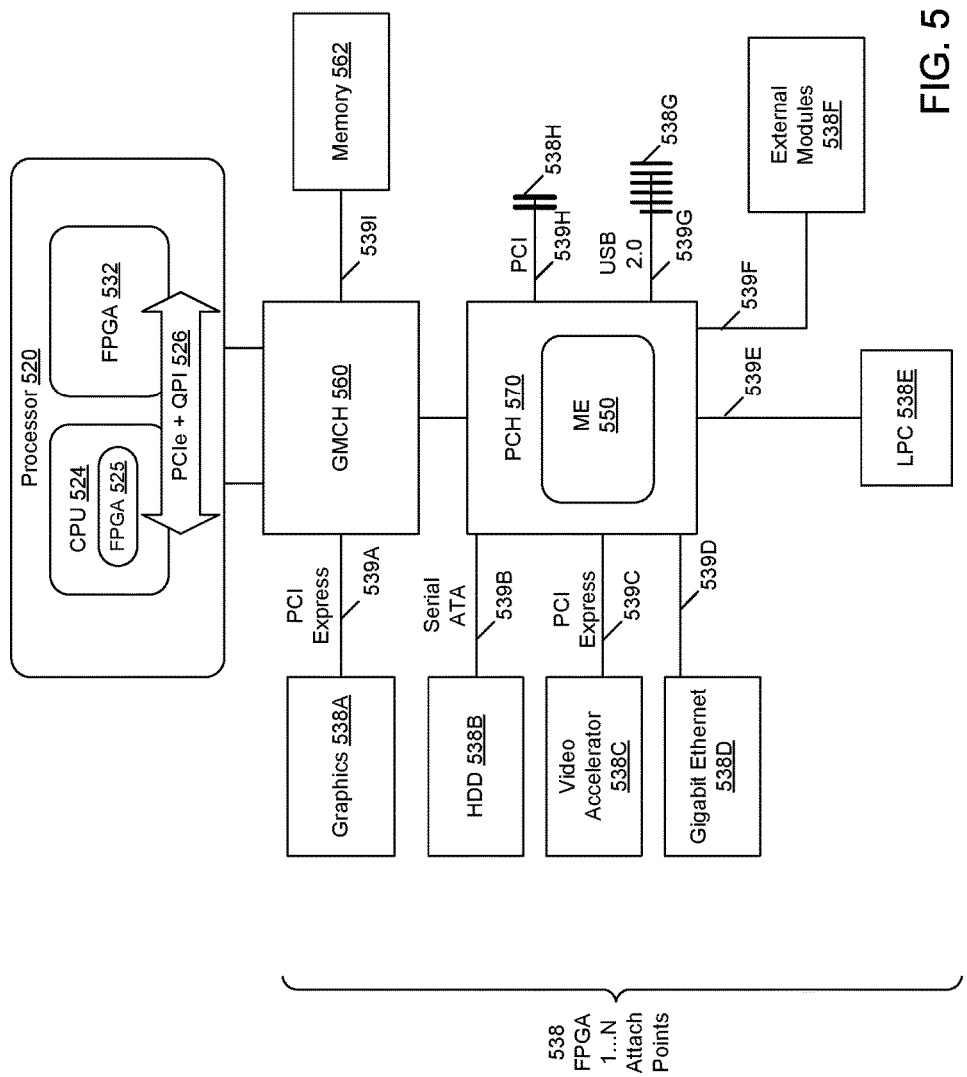
FIG. 5 shows a computing platform having heterogeneous FPGA attach points.

FIG. 5 shows heterogeneous attach point configurations for the FPGAs of a given platform. For example, platform FPGAs may have attach points with different characteristics such as varying latency, coherence, size, schedule, etc. As shown in FIG. 5, FPGAs such as FPGA 525 may be present within the CPU 524, thereby being directly connected. FPGAs may be used to accelerate functionality of various types of logic blocks. FPGAs, such as FPGA 532, may also be integrated into a multi-chip package (MCP) with an attach point into the CPU 524 which is integrated within processor 520. FPGA 532 communicates with CPU 524 via interconnections such as Peripheral Component Interconnect Express (PCIe) or Quick Path Interconnect (QPI) 526. FPGAs also may be next to the CPU on the board, thereby communicating with the CPU via a bus or other interconnection. Finally, FPGA accelerators may be part of a multi-chip package with an attach point into a chipset, network interface card (NIC), PCIe interconnection, or other platform component.

In the example shown in FIG. 5, logic blocks that can use FPGAs to accelerate or offload functionality, also referred to as "FPGA attach points," include graphics component 538A, hard disk drive 538B, video accelerator 538C, gigabit Ethernet interface 538D, low pin count (LPC) device 538E, external modules 538F, USB 2.0 port 538G, and PCI device 538H. In addition, graphics and memory controller hub (GMCH) 560 and memory 562 may serve as FPGA attach points.

Graphics and memory controller hub (GMCH) 560 provides an integrated video controller for communications between graphics component 538A, memory 562, and processor 520. Graphics component 538A is connected to GMCH 560 via PCIe interconnection 539A. Memory 562 is connected to GMCH 560 via interconnection 539I.

Platform controller hub (PCH) 570 provides a manageability engine 550 and enables communications from peripheral devices such as graphics component 538A, hard disk drive (HDD) 538B, video accelerator 538C, Gigabit Ethernet port 538D, Low Pin Count (LPC) device 538E (such as a keyboard), external modules 538F, USB 2.0 port 538G, and PCI device 538H. Each of these peripheral devices has a respective interconnection to PCH 570, such as serial ATA 539B from HDD 538B, PCIe interconnection 539C from video accelerator 538C, interconnection 539D from Gigabit Ethernet port 538D, LPC interconnection 539E from LPC device 538E, interconnection 539F from external modules 539F, interconnection 539G from USB 2.0 port 538G, and PCI interconnection 539H from PCI device 538H. GMCH 560 and memory 562 are also connected via an interconnection 539I. Each of GMCH 560 and memory 562 may serve as attach points.

Figure 6B:
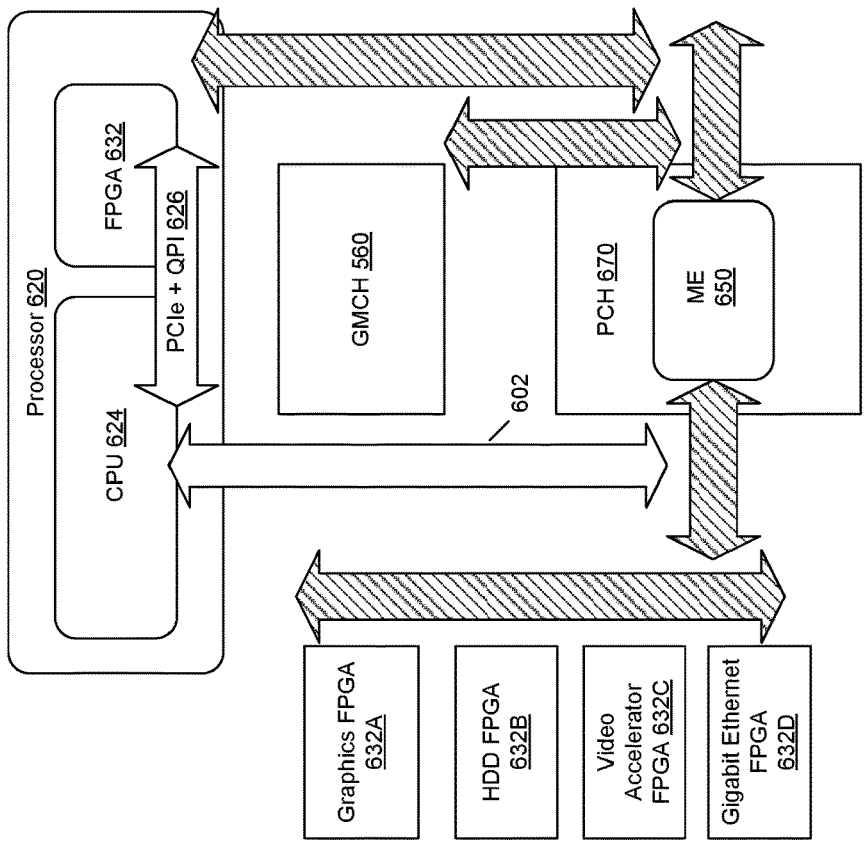
FIG. 6B shows a modified flow of information to license an upgradable capability of an FPGA of a platform.
Figure 6A:
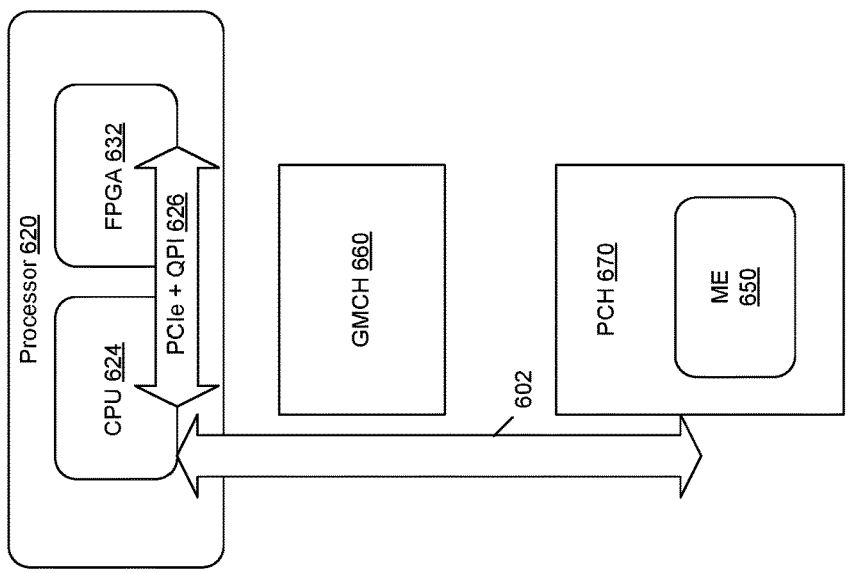
FIG. 6A shows a flow of information to license an upgradable capability of a CPU of a platform.

FIG. 6A shows an existing licensing flow for upgrading capabilities of a CPU 624, as in practice today. If a user decides to purchase an upgraded capability for a CPU 624 of processor 620, manageability engine 650 applies a hardware upgrade license that affects the configuration and behavior of the CPU 624. In the existing licensing flow, only capabilities of the CPU can be affected. The upgraded CPU capabilities are described as a "soft SKU (Stock Keeping Unit)," because the configuration of the CPU 624 is modified after purchase of the CPU.

FIG. 6B shows a modified licensing flow for dynamically upgrading capabilities of an FPGA as introduced in the present disclosure. As shown by the cross-hatched arrows, the modified licensing flow moves from manageability engine 650 to any FPGA attach point of the computing platform. The illustrated FPGA attach points include graphics FPGA 632A, hard disk drive (HDD) FPGA 632B, video accelerator FPGA 632C, gigabit Ethernet FPGA 632D, and graphics and memory controller hub (GMCH) 650. If a user purchases an upgraded capability for a selected FPGA of the platform, manageability engine 650 applies a hardware upgrade license that affects the configuration and behavior of the selected FPGA. The upgraded FPGA capabilities are referred to as "soft SKUs" as well.

Figure 7:
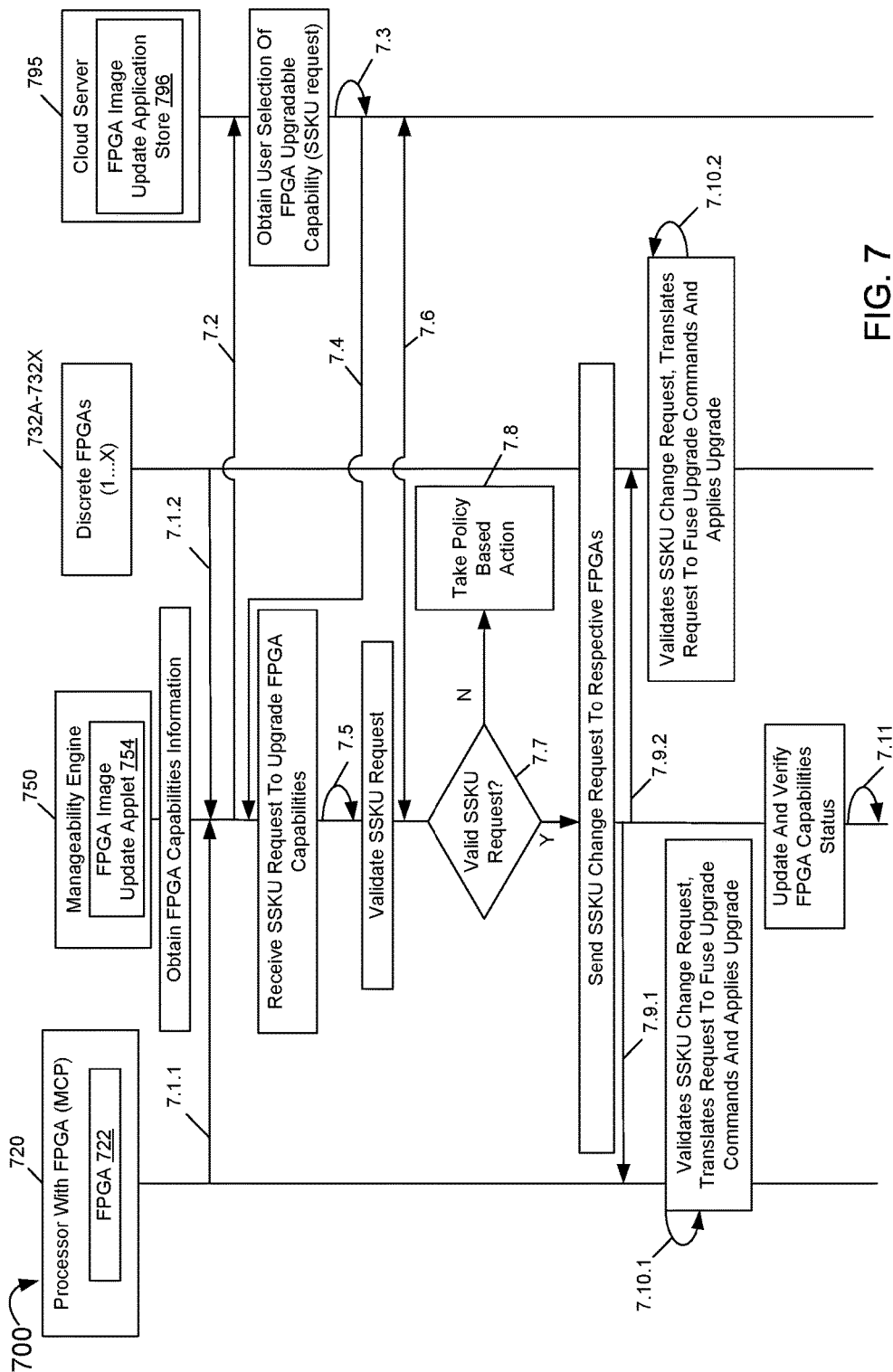
FIG. 7 is a data flow diagram showing a system for providing an FPGA image update application store.

FIG. 7 shows data flows between components of a platform 700 to dynamically upgrade capabilities of an FPGA in accordance with one embodiment. Processor 720 is a multi-chip package (MCP) including an FPGA 722. Manageability engine 750 is a manageability engine, such as manageability engine ME 650 provided within platform controller hub (PCH) 670 (not shown) of FIGS. 6A and 6B. Manageability engine 750 includes an FPGA image update applet 754, similar to the FPGA image update applet 354 of FIG. 3. Discrete FPGAs 732A through 732X represent FPGAs of the platform 700. Cloud server 795 provides an FPGA Image Update Application Store 796 from which users may select FPGA upgradable capabilities for a selected FPGA. Cloud server 795 also may serve as a management server that works in conjunction with manageability engine 750 to manage the configuration of platform 700 and the FPGAs 732A through 732X contained therein.

In action 7.1.1, manageability engine 750 receives FPGA capabilities information for FPGA 722 within processor 720. In action 7.1.2, manageability engine 750 receives FPGA capabilities information for discrete FPGAs 732A through 732X. Actions 7.1.1 and 7.1.2 may occur simultaneously. The FPGA capabilities information may be provided by, for example, a BIOS (Basic Input/Output System) during a secure boot of platform 700. In one embodiment, FPGA capabilities information is provided to manageability engine 750 via a manageability engine BIOS extension (MEBX). In one embodiment, FPGA image update applet 754 of manageability engine 750 processes the FPGA capabilities information.

In action 7.2, manageability engine 750 provides the FPGA capabilities information to cloud server 795 for use by FPGA image update application store 796. The FPGA capabilities information enables FPGA image update application store 796 to customize the presentation of FPGA updatable capabilities information to include only those FPGA upgradable capabilities that are available on platform 700.

In action 7.3, FPGA image update application store 796 of cloud server 795 obtains a user selection of an FPGA upgradable capability. In response to the user selection, FPGA image update application store 796 may create a "soft SKU (stock keeping unit)" to associate the selected upgradable FPGA capability with the SKU for an FPGA on the computing platform to receive the upgraded FPGA capability. In action 7.4, cloud server 795 communicates the selected FPGA upgradable capability (SSKU request) to manageability engine 750. In action 7.5, manageability engine 750 validates the SSKU request, and in action 7.6, manageability engine 750 (and particularly FPGA image update applet 754) works in conjunction with cloud server 795 to confirm that the SSKU request is valid. For example, cloud server 795 may confirm that the SSKU request corresponds to a valid FPGA image update provided in the FPGA image update application store 796.

At decision point 7.7, if the SSKU request is not valid, manageability engine 750 may take a policy-based action in action 7.8. For example, a notification may be provided to the user that the SSKU request is invalid and/or an administrator may be notified of the invalid SSKU request. If the SSKU request is determined at decision point 7.7 to be valid, FPGA image update applet 754 of manageability engine 750 sends the SSKU change request to the respective FPGAs selected for upgraded capabilities in actions 7.9.1 and 7.9.2.

In actions 7.10.1 and 7.10.2, each of the FPGAs provided with an SSKU change request validates the SSKU change request. For example, configuration logic configuration logic 344A of FPGA 342A of FIGS. 3 and 4 may determine whether the SSKU change request is valid. The SSKU change request may be considered to be valid, for example, if a license key embedded in the bitstream provided with the SSKU request indicates that a license has been issued to run the provided bitstream on the selected FPGA. If configuration logic for a respective FPGA determines that a given SSKU change request is valid, the SSKU change request is translated to fuse upgrade commands and the FPGA image update is installed.

When the FPGA image update(s) are successfully installed, manageability engine 750 updates a list of installed FPGA capabilities. In one embodiment, manageability engine 750 maintains a register with values indicating FPGA capabilities that are currently valid. Manageability engine 750 may verify the FPGA capabilities by, for example, determining that a license is valid for the currently-installed FPGA image. In another embodiment, FPGA image update applet 754 maintains an inventory of FPGA capabilities of the computing device to indicate that the selected upgradable FPGA capability is currently valid.

In action 7.11, manageability engine 750 updates and verifies the FPGA capabilities status. This status information may be reported as part of a system configuration report or other auditing report. In one embodiment, FPGA configuration manager logic, such as FPGA configuration manager 214 of FIG. 3, manages configuration of the FPGA and records a transaction for the issuance of the license and enablement of the selected upgradable FPGA capability. The transaction may be audited against a transaction log of licensed and enabled FPGA upgradable capabilities for the computing device, where the transaction log is maintained by a provider of the update to the FPGA reconfigurable image, such as cloud server 795.

Figure 8:
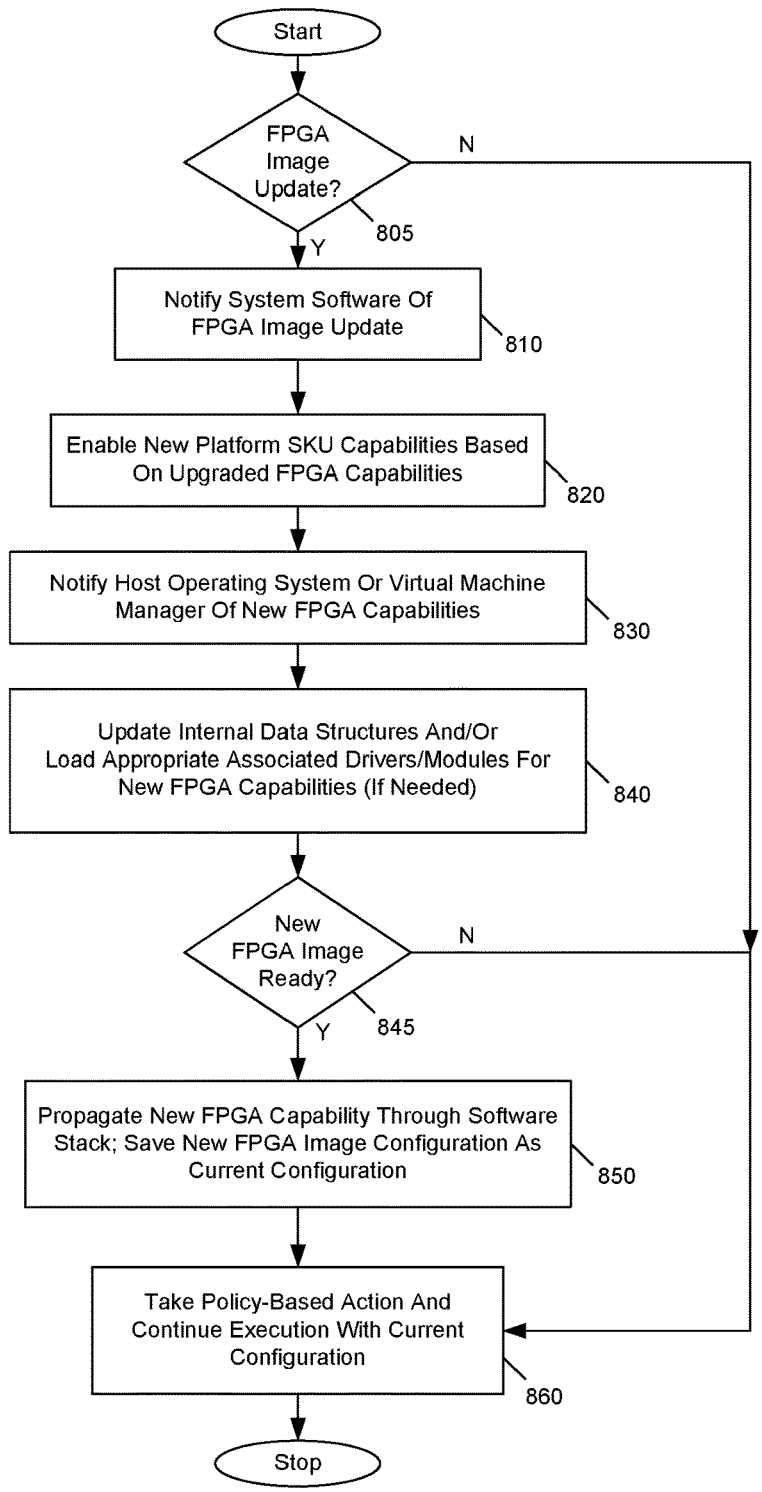
FIG. 8 is a flowchart of a method to propagate information about an FPGA image update through a software stack of a computing device.

FIG. 8 is a flowchart of actions taken by a computing device to configure the software components of a computing device to use an FPGA image update. For example, an FPGA image update may include RTL (Runtime Language) or other FPGA image update logic downloaded from an application store as described with reference to FIGS. 3 and 4 above. If the user of the application store has selected to upgrade capabilities of an FPGA, the process of FIG. 8 begins.

At "FPGA Image Update?" decision point 805, a determination is made whether an FPGA image update has been made available to the computing device. If not, control proceeds to "Take Policy Based Action and Continue Execution with Current Configuration" step 860. No further action is taken with regard to reconfiguring the FPGA or the platform at this time.

At "FPGA Image Update?" decision point 805, if a determination is made that an FPGA image update has been made available to the computing device, control proceeds to "Notify System Software of FPGA Image Update" block 810. In one embodiment, the system software is a Unified Extensible Firmware Interface (UEFI) BIOS, and the FPGA image update applet notifies the UEFI BIOS that an FPGA image update is available on the platform via a software interrupt. Control then proceeds to "Enable New Platform SKU Capabilities Based on Updated FPGA Capabilities" block 820.

At "Enable New Platform SKU Capabilities Based on Upgraded FPGA Capabilities" block 820, the upgraded FPGA capabilities may provide additional capabilities that can be enabled on the platform. For example, if an FPGA graphics component has been accelerated, the platform may be able to support additional types of graphics applications that could not be supported prior to the FPGA upgrade. The platform SKU can be updated to indicate that the platform now supports those additional types of graphics applications. In one embodiment, the UEFI BIOS enables the new platform SKU capabilities.

For example, when BIOS initializes installed hardware components, an FPGA bitstream may appear to BIOS as a new hardware component or an upgraded version of a previously-installed component. Enabling the updated FPGA capabilities provided by the FPGA bitstream may require initialization steps that differ from the initialization of a previous version of the component.

Additionally, BIOS may be employed as part of a trusted boot process where the firmware used is measured into an "integrity register" and/or compared with a whitelist measurement (as part of a secure boot scenario). Trusted and secure boot use cases may be part of BIOS processes that ensure that the FPGAs are not hosting malware.

In some embodiments, a measurement process may be employed that computes a cryptographic hash of the bitstream such that each bitstream may be recognized by its hash value. This hash value may be included in a trusted boot "extend" of an integrity register (such as a Trusted Platform Module (TPM) Platform Control Register (PCR)) or included in a whitelist measurement.

From "Enable New Platform SKU Capabilities Based on Updated Upgraded FPGA Capabilities" block 820, control then proceeds to "Notify Host Operating System or Virtual Machine Manager of New FPGA Capabilities" block 830.

At "Notify Host Operating System or Virtual Machine Manager of New FPGA Capabilities" block 830, a bottom layer of a software stack on the computing device is notified of the new FPGA capabilities. In one embodiment, the UEFI BIOS provides an Advanced Configuration and Power Interface (ACPI) notification to the host operating system or virtual machine manager of the new FPGA capabilities. Control then proceeds to "Update Internal Data Structures and Load Appropriate Associated Drivers/Module for New FPGA Capabilities (If Needed)" block 840.

At "Update Internal Data Structures and Load Appropriate Associated Drivers/Module for New FPGA Capabilities (If Needed)" block 840, the operating system or virtual machine manager (OS/VMM) notified at block 830 performs actions needed for the new FPGA capabilities to be used. For example, the OS/VMM may update internal data structures and/or load associated drivers or other modules needed for the new FPGA capabilities to be used on the platform. Control then proceeds to "New FPGA Image Ready?" decision point 845.

At "New FPGA Image Ready?" decision point 845, a determination is made whether the new FPGA image is ready. For example, as described above with reference to FIG. 2, the updated FPGA image may be synthesized from an RTL (Runtime Language) definition into a bitstream. If the synthesis of the RTL definition into the bitstream is performed locally on the computing device, the synthesis may consume significant local resources and the bitstream may not be immediately available. If the new FPGA image is not ready at "New FPGA Image Ready?" decision point 845, control proceeds to "Take Policy-Based Action and Continue Execution with Current Configuration" block 860. For example, a policy-based action may be taken to schedule a later attempt to use the new FPGA capability when the new FPGA image becomes available. Execution then continues with the current configuration without the new FPGA capability.

If the new FPGA image is ready at "New FPGA Image Ready?" decision point 845, control proceeds to "Propagate New FPGA Capability through Software Stack; Save New FPGA Image Configuration as Current Configuration" block 850. For example, the operating system may update frameworks (libraries, classes, etc.) and notify applications of the new FPGA capability. The new FPGA image configuration may be saved as the current configuration for the FPGA.

From "Propagate New FPGA Capability through Software Stack; Save New FPGA Image Configuration as Current Configuration" block 850, control proceeds to "Take Policy-Based Action and Continue Execution with Current Configuration" block 860. Execution continues with the updated FPGA image as the current configuration.

The following Examples pertain to further embodiments.

In Example 1, a computing device to dynamically configure an FPGA includes a field-programmable gate array (FPGA) and a reconfigurable FPGA image associated with the FPGA; user interface logic to cause at least one upgradable capability of the FPGA to be displayed to a user of the computing device and receive a selection of a selected upgradable capability and an acceptance of a license for the selected upgradable capability from the user; license management logic to issue a license to enable the selected upgradable capability of the FPGA in exchange for the acceptance of the license by the user; and FPGA image update logic to obtain an update to the reconfigurable FPGA image associated with the FPGA in response to issuance of the license and to cause the update to the reconfigurable FPGA image to be installed on the FPGA to enable the selected upgradable capability of the FPGA.

Example 2 includes the computing device of Example 1, where to obtain the update to the reconfigurable FPGA image comprises to obtain FPGA runtime language (RTL) logic associated with the selected upgradable capability; the FPGA image update logic is further to request a bitstream for the update to the reconfigurable FPGA image to be synthesized from the FPGA runtime language (RTL) logic; and to cause the update to the reconfigurable FPGA image to be installed on the FPGA comprises to cause the bitstream to be installed on the FPGA.

Example 3 includes the computing device of Example 1, where the user interface logic is further to cause the at least one upgradable capability of the FPGA to be displayed to the user in association with a user selection of an application associated with the at least one upgradable capability.

Example 4 includes the computing device of Example 1, where the FPGA image update logic is further to verify the update to the reconfigurable FPGA image prior to causing the update to the reconfigurable FPGA image to be installed on the FPGA; cause the update to the reconfigurable FPGA image to be installed after verifying the update; and notify an operating system of the computing device of the update to the reconfigurable FPGA image, where the operating system is further to expose the selected upgradable capability of the FPGA to at least one component of a software stack managed by the operating system.

Example 5 includes the computing device of Example 4, where the update to the reconfigurable FPGA image is to be installed at a first runtime without rebooting the computing device, the operating system is to be notified of the update to the reconfigurable FPGA image at the first runtime without rebooting the computing device, and the selected upgradable capability of the FPGA is exposed to the at least one component of the software stack at the first runtime without rebooting the computing device.

Example 6 includes the computing device of Example 4, where the operating system exposes the selected upgradable capability of the FPGA by configuring an operating system driver or library that is used for dynamic linking to an application, and the application dynamically acquires new functionality or achieves improved performance subsequent to enablement of the selected upgradable capability of the FPGA.

Example 7 includes the computing device of Example 1, and further includes virtual machine monitor logic to execute a virtual machine monitor, where the virtual machine monitor manages a first guest virtual machine and a second guest virtual machine, the virtual machine monitor is to expose the selected upgradable capability of the FPGA to one of the first guest virtual machine and the second guest virtual machine, and the exposed guest virtual machine is enabled to use the selected upgradable capability of the FPGA at a first runtime.

Example 8 includes the computing device of Example 1, and further includes trusted execution environment logic to establish a trusted execution environment; and verification logic to verify the FPGA image update logic and the reconfigurable FPGA image for the FPGA during a secure boot of the computing device within the trusted execution environment.

Example 9 includes the computing device of Example 8, where to verify the FPGA image update logic is to calculate a first measurement of the FPGA image update logic and to compare the first measurement to a first whitelisted measurement for the FPGA image update logic and to verify the FPGA image update logic if the first measurement matches the first whitelisted measurement; and to verify the reconfigurable FPGA image is to calculate a second measurement of the reconfigurable FPGA image and to compare the second measurement to a second whitelisted measurement of the reconfigurable FPGA image and to verify the reconfigurable FPGA image if the second measurement matches the second whitelisted measurement.

Example 10 includes the computing device of Example 1, where the FPGA image update logic is to notify system software of the computing device that the selected upgradable capability of the FPGA has been enabled.

Example 11 includes the computing device of Example 1, where the FPGA image update logic is further to update an inventory of FPGA capabilities of the computing device to indicate that the selected upgradable FPGA capability is currently valid.

Example 12 includes the computing device of Example 1, and further includes FPGA configuration manager logic to manage configuration of the FPGA, where the license authorizes enabling the selected upgradable FPGA capability until occurrence of a license expiration event associated with the license; and the license management logic and the FPGA configuration manager logic cause the selected upgradable FPGA capability to be disabled upon the occurrence of the license expiration event.

Example 13 includes the computing device of Example 12, where the FPGA configuration manager logic is further to record a transaction for the issuance of the license and enablement of the selected upgradable FPGA capability.

Example 14 is a method to dynamically configure an FPGA including causing at least one upgradable capability of an FPGA of a computing device to be displayed to a user of the computing device and receiving a selection of a selected upgradable capability of the at least one upgradable capability and an acceptance of a license for the selected upgradable capability from the user, where the FPGA is associated with a reconfigurable FPGA image; issuing a license to enable the selected upgradable capability of the FPGA in exchange for the acceptance of the license by the user; obtaining an update to the reconfigurable FPGA image associated with the FPGA in response to issuance of the license; and causing the update to the reconfigurable FPGA image to be installed on the FPGA to enable the selected upgradable capability of the FPGA.

Example 15 includes the method of Example 14, where obtaining the update to the reconfigurable FPGA image comprises obtaining FPGA runtime language (RTL) logic associated with the selected upgradable capability; and the method further comprises requesting a bitstream for the update to the reconfigurable FPGA image to be synthesized from the FPGA runtime language (RTL) logic, where causing the update to the reconfigurable FPGA image to be installed on the FPGA comprises causing the bitstream to be installed on the FPGA.

Example 16 includes the method of Example 14, and further includes causing the at least one upgradable capability of the FPGA to be displayed to the user in association with a user selection of an application associated with the at least one upgradable capability.

Example 17 includes the method of Example 14, and further includes verifying the update to the reconfigurable FPGA image prior to causing the update to the reconfigurable FPGA image to be installed on the FPGA; causing the update to the reconfigurable FPGA image to be installed after verifying the update; and notifying an operating system of the computing device of the update to the reconfigurable FPGA image, where the operating system is further to expose the selected upgradable capability of the FPGA to at least one component of a software stack managed by the operating system.

Example 18 includes the method of Example 14, where the update to the reconfigurable FPGA image is to be installed at a first runtime without rebooting the computing device, the operating system is to be notified of the update to the reconfigurable FPGA image at the first runtime without rebooting the computing device, and the selected upgradable capability of the FPGA is exposed to the at least one component of the software stack at the first runtime without rebooting the computing device.

Example 19 includes the method of Example 14, where the operating system exposes the selected upgradable capability of the FPGA by configuring an operating system driver or library that is used for dynamic linking to an application, and the application dynamically acquires new functionality or achieves improved performance subsequent to enablement of the selected upgradable capability of the FPGA.

Example 20 includes the method of Example 14, and further includes executing a virtual machine monitor, where the virtual machine monitor is to manage a first guest virtual machine and a second guest virtual machine, the virtual machine monitor is to expose the selected upgradable capability of the FPGA to one of the first guest virtual machine and the second guest virtual machine, and the exposed guest virtual machine is enabled to use the selected upgradable capability of the FPGA at a first runtime.

Example 21 further includes the method of Example 14, and further includes establishing a trusted execution environment, and executing verification logic within the trusted execution environment; where the verification logic is further to verify the reconfigurable FPGA image during a secure boot of the computing device, and the verification logic is further to verify, during the secure boot, an FPGA image update logic that is to install the update to the reconfigurable FPGA image on the FPGA.

Example 22 further includes the method of Example 21, where to verify the FPGA image update logic is to calculate a first measurement of the FPGA image update logic and to compare the first measurement to a first whitelisted measurement for the FPGA image update logic and to verify the FPGA image update logic if the first measurement matches the first whitelisted measurement; and to verify the reconfigurable FPGA image is to calculate a second measurement of the reconfigurable FPGA image and to compare the second measurement to a second whitelisted measurement of the reconfigurable FPGA image and to verify the reconfigurable FPGA image if the second measurement matches the second whitelisted measurement.

Example 23 includes the method of Example 14, and further includes notifying system software of the computing device that the selected upgradable capability of the FPGA has been enabled.

Example 24 includes the method of Example 14, and further includes updating an inventory of FPGA capabilities of the computing device to indicate that the selected upgradable FPGA capability is currently valid.

Example 25 includes the method of Example 14, where the license authorizes enabling the selected upgradable FPGA capability until occurrence of a license expiration event associated with the license; and the method further comprises: causing the selected upgradable FPGA capability to be disabled upon the occurrence of the license expiration event.

Example 26 includes the method of Example 14, and further includes recording a transaction for the issuance of the license and enablement of the selected upgradable FPGA capability.

Example 27 includes a computer-readable medium to dynamically configure an FPGA, where the computer-readable medium includes instructions that, when executed, cause a machine to perform the methods of any of the above Examples.

Example 28 includes an apparatus to dynamically configure an FPGA, the apparatus including means to perform the methods of any of the above Examples.

Example 29 includes a computer-readable medium including data to be used by at least one machine to fabricate at least one integrated circuit to perform the method of any one of the above Examples.

Example 30 includes an apparatus to dynamically configure an FPGA, where the apparatus includes means for causing at least one upgradable capability of an FPGA of the computing device to be displayed to a user and to receive a selection of a selected upgradable capability of the at least one upgradable capability and an acceptance of a license for the selected upgradable capability from the user, where the FPGA is associated with a reconfigurable FPGA image; means for issuing a license to enable the selected upgradable capability of the FPGA in exchange for the acceptance of the license by the user; means for obtaining an update to the reconfigurable FPGA image associated with the FPGA in response to issuance of the license; and means for causing the update to the reconfigurable FPGA image to be installed on the FPGA to enable the selected upgradable capability of the FPGA.

Example 31 includes the apparatus of Example 30, where the means for obtaining the update to the reconfigurable FPGA image comprises means for obtaining FPGA runtime language (RTL) logic associated with the selected upgradable capability; and where the apparatus further includes means for requesting a bitstream for the update to the reconfigurable FPGA image to be synthesized from the FPGA runtime language (RTL) logic, where the means for causing the update to the reconfigurable FPGA image to be installed on the FPGA comprise means for causing the bitstream to be installed on the FPGA.

Example 32 includes the apparatus of Example 30, and further includes means for causing the at least one upgradable capability of the FPGA to be displayed to the user in association with a user selection of an application associated with the at least one upgradable capability.

Example 33 includes the apparatus of Example 30, and further includes means for verifying the update to the reconfigurable FPGA image prior to causing the update to the reconfigurable FPGA image to be installed on the FPGA; means for causing the update to the reconfigurable FPGA image to be installed after verifying the update; and means for notifying an operating system of the computing device of the update to the reconfigurable FPGA image, where the operating system is further to expose the selected upgradable capability of the FPGA to at least one component of a software stack managed by the operating system.

Example 34 includes the apparatus of Example 30, where the update to the reconfigurable FPGA image is to be installed at a first runtime without rebooting the computing device, the operating system is to be notified of the update to the reconfigurable FPGA image at the first runtime without rebooting the computing device, and the selected upgradable capability of the FPGA is exposed to the at least one component of the software stack at the first runtime without rebooting the computing device.

Example 35 includes the apparatus of Example 30, where the operating system exposes the selected upgradable capability of the FPGA by configuring an operating system driver or library that is used for dynamic linking to an application, and the application dynamically acquires new functionality or achieves improved performance subsequent to enablement of the selected upgradable capability of the FPGA.

Example 36 includes the apparatus of Example 30, and further includes means for executing a virtual machine monitor, where the virtual machine monitor is to manage a first guest virtual machine and a second guest virtual machine, the virtual machine monitor is to expose the selected upgradable capability of the FPGA to one of the first guest virtual machine and the second guest virtual machine, and the exposed guest virtual machine is enabled to use the selected upgradable capability of the FPGA at a first runtime.

Example 37 includes the apparatus of Example 30, and further includes means for establishing a trusted execution environment, and means for executing verification logic within the trusted execution environment; where the verification logic is further to verify the reconfigurable FPGA image during a secure boot of the computing device, and the verification logic is further to verify, during the secure boot, an FPGA image update logic that is to install the update to the reconfigurable FPGA image on the FPGA.

Example 38 includes the apparatus of Example 37, where to verify the FPGA image update logic is to calculate a first measurement of the FPGA image update logic and to compare the first measurement to a first whitelisted measurement for the FPGA image update logic and to verify the FPGA image update logic if the first measurement matches the first whitelisted measurement; and to verify the reconfigurable FPGA image is to calculate a second measurement of the reconfigurable FPGA image and to compare the second measurement to a second whitelisted measurement of the reconfigurable FPGA image and to verify the reconfigurable FPGA image if the second measurement matches the second whitelisted measurement.

Example 39 includes the apparatus of Example 30, and further includes means for notifying system software of the computing device that the selected upgradable capability of the FPGA has been enabled.

Example 40 includes the apparatus of Example 30, and further includes means for updating an inventory of FPGA capabilities of the computing device to indicate that the selected upgradable FPGA capability is currently valid.

Example 41 includes the apparatus of Example 30, where the license authorizes enabling the selected upgradable FPGA capability until occurrence of a license expiration event associated with the license; and the apparatus further includes means for causing the selected upgradable FPGA capability to be disabled upon the occurrence of the license expiration event.

Example 42 includes the apparatus of Example 30, and further includes means for recording a transaction for the issuance of the license and enablement of the selected upgradable FPGA capability.

Understand that various combinations of the above Examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:
1. A computing device comprising:
   a field-programmable gate array (FPGA) and a reconfigurable FPGA image associated with the FPGA;
   user interface logic to cause at least one upgradable capability of the FPGA to be displayed to a user of the computing device and receive a selection of a selected upgradable capability of the at least one upgradable capability and an acceptance of a license for the selected upgradable capability from the user;

license management logic to issue a license to enable the selected upgradable capability of the FPGA in exchange for the acceptance of the license by the user; and FPGA image update logic to obtain an update to the reconfigurable FPGA image associated with the FPGA in response to issuance of the license and to cause the update to the reconfigurable FPGA image to be installed on the FPGA to enable the selected upgradable capability of the FPGA.

2. The computing device of claim 1, wherein
to obtain the update to the reconfigurable FPGA image comprises to obtain FPGA runtime language (RTL) logic associated with the selected upgradable capability;
the FPGA image update logic is further to request a bitstream for the update to the reconfigurable FPGA image to be synthesized from the FPGA runtime language (RTL) logic; and
to cause the update to the reconfigurable FPGA image to be installed on the FPGA comprises to cause the bitstream to be installed on the FPGA.

3. The computing device of claim 1, wherein
the user interface logic is further to:
cause the at least one upgradable capability of the FPGA to be displayed to the user in association with a user selection of an application associated with the at least one upgradable capability.

4. The computing device of claim 1, wherein
the FPGA image update logic is further to:
verify the update to the reconfigurable FPGA image prior to causing the update to the reconfigurable FPGA image to be installed on the FPGA;
cause the update to the reconfigurable FPGA image to be installed after verifying the update; and
notify an operating system of the computing device of the update to the reconfigurable FPGA image, wherein the operating system is further to expose the selected upgradable capability of the FPGA to at least one component of a software stack managed by the operating system.

5. The computing device of claim 4, wherein
the update to the reconfigurable FPGA image is to be installed at a first runtime without rebooting the computing device,
the operating system is to be notified of the update to the reconfigurable FPGA image at the first runtime without rebooting the computing device, and
the selected upgradable capability of the FPGA is exposed to the at least one component of the software stack at the first runtime without rebooting the computing device.

6. The computing device of claim 4, wherein
the operating system exposes the selected upgradable capability of the FPGA by configuring an operating system driver or library that is used for dynamic linking to an application, and
the application dynamically acquires new functionality or achieves improved performance subsequent to enablement of the selected upgradable capability of the FPGA.

7. The computing device of claim 1, further comprising:
virtual machine monitor logic to execute a virtual machine monitor, wherein
the virtual machine monitor manages a first guest virtual machine and a second guest virtual machine,
the virtual machine monitor is to expose the selected upgradable capability of the FPGA to one of the first guest virtual machine and the second guest virtual machine, and
the exposed guest virtual machine is enabled to use the selected upgradable capability of the FPGA at a first runtime.

8. The computing device of claim 1, further comprising:
trusted execution environment logic to establish a trusted execution environment; and
verification logic to verify the FPGA image update logic and the reconfigurable FPGA image for the FPGA during a secure boot of the computing device within the trusted execution environment.

9. The computing device of claim 8, wherein
to verify the FPGA image update logic is to calculate a first measurement of the FPGA image update logic and to compare the first measurement to a first whitelisted measurement for the FPGA image update logic and to verify the FPGA image update logic if the first measurement matches the first whitelisted measurement; and
to verify the reconfigurable FPGA image is to calculate a second measurement of the reconfigurable FPGA image and to compare the second measurement to a second whitelisted measurement of the reconfigurable FPGA image and to verify the reconfigurable FPGA image if the second measurement matches the second whitelisted measurement.

10. The computing device of claim 1, wherein the FPGA image update logic is to notify system software of the computing device that the selected upgradable capability of the FPGA has been enabled.

11. The computing device of claim 1, wherein
the FPGA image update logic is further to update an inventory of FPGA capabilities of the computing device to indicate that the selected upgradable FPGA capability is currently valid.

12. The computing device of claim 1, further comprising:
FPGA configuration manager logic to manage configuration of the FPGA, wherein
the license authorizes enabling the selected upgradable FPGA capability until occurrence of a license expiration event associated with the license; and
the license management logic and the FPGA configuration manager logic cause the selected upgradable FPGA capability to be disabled upon the occurrence of the license expiration event.

13. The computing device of claim 12, wherein
the FPGA configuration manager logic is further to record a transaction for the issuance of the license and enablement of the selected upgradable FPGA capability.

14. At least one non-transitory computer-readable medium comprising a plurality of executable computer instructions stored thereon that, in response to being executed by a processor, cause a computing device to:
cause at least one upgradable capability of an FPGA of the computing device to be displayed to a user of the computing device and receive a selection of a selected upgradable capability of the at least one upgradable capability and an acceptance of a license for the selected upgradable capability from the user, wherein the FPGA is associated with a reconfigurable FPGA image;
issue a license to enable the selected upgradable capability of the FPGA in exchange for the acceptance of the license by the user;

obtain an update to the reconfigurable FPGA image associated with the FPGA in response to issuance of the license; and cause the update to the reconfigurable FPGA image to be installed on the FPGA to enable the selected upgradable capability of the FPGA.

15. The at least one computer-readable medium of claim 14, wherein to obtain the update to the reconfigurable FPGA image comprises to obtain FPGA runtime language (RTL) logic associated with the selected upgradable capability; and the instructions further cause the computing device to:

request a bitstream for the update to the reconfigurable FPGA image to be synthesized from the FPGA runtime language (RTL) logic, wherein to cause the update to the reconfigurable FPGA image to be installed on the FPGA comprises to cause the bitstream to be installed on the FPGA.

16. The at least one computer-readable medium of claim 14, wherein the instructions further cause the computing device to:

cause the at least one upgradable capability of the FPGA to be displayed to the user in association with a user selection of an application associated with the at least one upgradable capability.

17. The at least one computer-readable medium of claim 14, wherein the instructions further cause the computing device to:

verify the update to the reconfigurable FPGA image prior to causing the update to the reconfigurable FPGA image to be installed on the FPGA;

cause the update to the reconfigurable FPGA image to be installed after verifying the update; and notify an operating system of the computing device of the update to the reconfigurable FPGA image, wherein the operating system is further to expose the selected upgradable capability of the FPGA to at least one component of a software stack managed by the operating system.

18. The at least one computer-readable medium of claim 17, wherein the operating system exposes the selected upgradable capability of the FPGA by configuring an operating system driver or library that is used for dynamic linking to an application, and the application dynamically acquires new functionality or achieves improved performance subsequent to enablement of the selected upgradable capability of the FPGA.

19. The at least one computer-readable medium of claim 14, wherein the instructions further cause the computing device to:

execute a virtual machine monitor, wherein the virtual machine monitor is to manage a first guest virtual machine and a second guest virtual machine, the virtual machine monitor is to expose the selected upgradable capability of the FPGA to one of the first guest virtual machine and the second guest virtual machine, and the exposed guest virtual machine is enabled to use the selected upgradable capability of the FPGA at a first runtime.

20. The at least one computer-readable medium of claim 14, wherein the instructions further cause the computing device to:

establish a trusted execution environment, and execute verification logic within the trusted execution environment; wherein the verification logic is further to verify the reconfigurable FPGA image during a secure boot of the computing device, and the verification logic is further to verify, during the secure boot, an FPGA image update logic that is to install the update to the reconfigurable FPGA image on the FPGA.

21. The at least one computer-readable medium of claim 20, wherein to verify the FPGA image update logic is to calculate a first measurement of the FPGA image update logic and to compare the first measurement to a first whitelisted measurement for the FPGA image update logic and to verify the FPGA image update logic if the first measurement matches the first whitelisted measurement; and to verify the reconfigurable FPGA image is to calculate a second measurement of the reconfigurable FPGA image and to compare the second measurement to a second whitelisted measurement of the reconfigurable FPGA image and to verify the reconfigurable FPGA image if the second measurement matches the second whitelisted measurement.

22. The at least one computer-readable medium of claim 14, wherein the instructions are further to:

notify system software of the computing device that the selected upgradable capability of the FPGA has been enabled.

23. The at least one computer-readable medium of claim 14, wherein the instructions are further to:

update an inventory of FPGA capabilities of the computing device to indicate that the selected upgradable FPGA capability is currently valid.

24. The at least one computer-readable medium of claim 14, wherein the license authorizes enabling the selected upgradable FPGA capability until occurrence of a license expiration event associated with the license; and the instructions are further to cause the selected upgradable FPGA capability to be disabled upon the occurrence of the license expiration event.

25. The at least one computer-readable medium of claim 14, wherein the instructions are further to:

record a transaction for the issuance of the license and enablement of the selected upgradable FPGA capability.

26. A computer-implemented method comprising:

causing at least one upgradable capability of an FPGA of a computing device to be displayed to a user of the computing device and receiving a selection of a selected upgradable capability of the at least one upgradable capability and an acceptance of a license for the selected upgradable capability from the user, wherein the FPGA is associated with a reconfigurable FPGA image;

issuing a license to enable the selected upgradable capability of the FPGA in exchange for the acceptance of the license by the user;

obtaining an update to the reconfigurable FPGA image associated with the FPGA in response to issuance of the license; and causing the update to the reconfigurable FPGA image to be installed on the FPGA to enable the selected upgradable capability of the FPGA.

27. The method of claim 26, wherein
obtaining the update to the reconfigurable FPGA image comprises obtaining FPGA runtime language (RTL) logic associated with the selected upgradable capability; and
the method further comprises:
requesting a bitstream for the update to the reconfigurable FPGA image to be synthesized from the FPGA runtime language (RTL) logic, wherein causing the update to the reconfigurable FPGA image to be installed on the FPGA comprises causing the bitstream to be installed on the FPGA.

28. The method of claim 26, further comprising:
causing the at least one upgradable capability of the FPGA to be displayed to the user in association with a user selection of an application associated with the at least one upgradable capability.

29. The method of claim 26, further comprising:
verifying the update to the reconfigurable FPGA image prior to causing the update to the reconfigurable FPGA image to be installed on the FPGA;
causing the update to the reconfigurable FPGA image to be installed after verifying the update; and
notifying an operating system of the computing device of the update to the reconfigurable FPGA image, wherein the operating system is further to expose the selected upgradable capability of the FPGA to at least one component of a software stack managed by the operating system.

30. The method of claim 26, wherein
the operating system exposes the selected upgradable capability of the FPGA by configuring an operating system driver or library that is used for dynamic linking to an application, and
the application dynamically acquires new functionality or achieves improved performance subsequent to enablement of the selected upgradable capability of the FPGA.

31. The method of claim 26, further comprising:
executing a virtual machine monitor, wherein
the virtual machine monitor is to manage a first guest virtual machine and a second guest virtual machine,
the virtual machine monitor is to expose the selected upgradable capability of the FPGA to one of the first guest virtual machine and the second guest virtual machine, and
the exposed guest virtual machine is enabled to use the selected upgradable capability of the FPGA at a first runtime.

32. The method of claim 26, wherein
the license authorizes enabling the selected upgradable FPGA capability until occurrence of a license expiration event associated with the license; and
the method further comprising causing the selected upgradable FPGA capability to be disabled upon the occurrence of the license expiration event.

33. An apparatus comprising:
means for causing at least one upgradable capability of an FPGA of a computing device to be displayed to a user of the computing device and to receive a selection of a selected upgradable capability of the at least one upgradable capability and an acceptance of a license for the selected upgradable capability from the user, wherein the FPGA is associated with a reconfigurable FPGA image;
means for issuing a license to enable the selected upgradable capability of the FPGA in exchange for the acceptance of the license by the user;
means for obtaining an update to the reconfigurable FPGA image associated with the FPGA in response to issuance of the license; and
means for causing the update to the reconfigurable FPGA image to be installed on the FPGA to enable the selected upgradable capability of the FPGA.

34. The apparatus of claim 33, wherein
the means for obtaining the update to the reconfigurable FPGA image comprises means for obtaining FPGA runtime language (RTL) logic associated with the selected upgradable capability; and
wherein the apparatus further comprises:
means for requesting a bitstream for the update to the reconfigurable FPGA image to be synthesized from the FPGA runtime language (RTL) logic, wherein the means for causing the update to the reconfigurable FPGA image to be installed on the FPGA comprise means for causing the bitstream to be installed on the FPGA.

35. The apparatus of claim 33, wherein
the license authorizes enabling the selected upgradable FPGA capability until occurrence of a license expiration event associated with the license; and
the apparatus further comprises means for causing the selected upgradable FPGA capability to be disabled upon the occurrence of the license expiration event.

* * * * *